US012092684B2

(12) United States Patent
Fayneh et al.

(10) Patent No.: US 12,092,684 B2
(45) Date of Patent: Sep. 17, 2024

(54) INTEGRATED CIRCUIT WORKLOAD, TEMPERATURE, AND/OR SUB-THRESHOLD LEAKAGE SENSOR

(71) Applicant: PROTEANTECS LTD., Haifa (IL)

(72) Inventors: Eyal Fayneh, Givatayim (IL); Inbar Weintrob, Givat-Ada (IL); Evelyn Landman, Haifa (IL); Yahel David, Kibbutz Gazit (IL); Shai Cohen, Haifa (IL); Guy Redler, Haifa (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 18/215,828

(22) Filed: Jun. 29, 2023

(65) Prior Publication Data

US 2023/0341460 A1 Oct. 26, 2023

Related U.S. Application Data

(63) Continuation of application No. 17/703,438, filed on Mar. 24, 2022, now Pat. No. 11,740,281, which is a
(Continued)

(51) Int. Cl.
*G01R 31/28* (2006.01)
(52) U.S. Cl.
CPC .................. *G01R 31/2853* (2013.01)
(58) Field of Classification Search
CPC ............... G01R 31/2884; G01R 31/52; G01R 31/2621; G01K 7/00; G01K 7/346; G01K 7/32
(Continued)

(56) References Cited

U.S. PATENT DOCUMENTS

| 4,555,663 A | 11/1985 | Shimizu |
| 5,548,539 A | 8/1996 | Vlach et al. |

(Continued)

FOREIGN PATENT DOCUMENTS

| CN | 101014991 A | 8/2007 |
| CN | 101344898 A | 1/2009 |

(Continued)

OTHER PUBLICATIONS

Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.
(Continued)

*Primary Examiner* — Giovanni Astacio-Oquendo
(74) *Attorney, Agent, or Firm* — The Roy Gross Law Firm, LLC; Roy Gross

(57) ABSTRACT

An integrated circuit (IC) comprising: a margin measurement circuit configured to monitor multiple data paths of the IC and to output, at different times, different ranges of remaining margins of the multiple data paths; a workload sensor configured to output a value representing aggregate operational stress experienced by the IC over a period of time ending at each of the different times; and a processor configured to: (i) compute, based on the value output by said workload sensor, an upper bound and a lower bound of change of the remaining margin of the IC, and (ii) compute upper and lower bounds of a current remaining margin of the IC, based on (a) the upper and lower bounds of change, and (b) a remaining margin indicated by a border between two adjacent ranges outputted by the margin measurement circuit.

23 Claims, 14 Drawing Sheets

Related U.S. Application Data continuation-in-part of application No. 16/960,421, filed as application No. PCT/IL2019/050039 on Jan. 8, 2019, now Pat. No. 11,408,932.

(60) Provisional application No. 63/279,373, filed on Nov. 15, 2021, provisional application No. 62/614,706, filed on Jan. 8, 2018.

(58) Field of Classification Search
USPC ................................ 324/750.3, 537, 500
See application file for complete search history.

(56) References Cited

U.S. PATENT DOCUMENTS

| | | |
|---|---|---|
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |
| 5,966,527 A | 10/1999 | Krivokapic et al. |
| 6,172,546 B1 | 1/2001 | Liu et al. |
| 6,182,253 B1 | 1/2001 | Lawrence et al. |
| 6,486,716 B1 | 11/2002 | Minami et al. |
| 6,586,921 B1 | 7/2003 | Sunter |
| 6,683,484 B1 | 1/2004 | Kueng et al. |
| 6,807,503 B2 | 10/2004 | Ye et al. |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,369,893 B2 | 5/2008 | Gunderson |
| 7,443,189 B2 | 10/2008 | Ramappa |
| 7,455,450 B2 | 11/2008 | Liu |
| 7,501,832 B2 | 3/2009 | Spuhler et al. |
| 7,649,373 B2 | 1/2010 | Tokunaga |
| 7,701,246 B1 | 4/2010 | Plants et al. |
| 7,818,601 B2 | 10/2010 | LaBerge |
| 7,877,657 B1 | 1/2011 | Miller et al. |
| 7,940,862 B2 | 5/2011 | Tanaka et al. |
| 8,001,512 B1 | 8/2011 | White |
| 8,086,978 B2 | 12/2011 | Zhang et al. |
| 8,170,067 B2 | 5/2012 | Zerbe et al. |
| 8,279,976 B2 | 10/2012 | Lin et al. |
| 8,310,265 B2 | 11/2012 | Zjajo et al. |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 | 1/2014 | Lai |
| 8,825,158 B2 | 9/2014 | Swerdlow |
| 8,996,937 B2 | 3/2015 | Jain et al. |
| 9,275,706 B2 | 3/2016 | Tam |
| 9,424,952 B1 | 8/2016 | Seok et al. |
| 9,490,787 B1 | 11/2016 | Kho et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon et al. |
| 9,714,966 B2 | 7/2017 | Chen et al. |
| 9,760,672 B1 | 9/2017 | Taneja et al. |
| 9,791,834 B1 | 10/2017 | Nassar et al. |
| 9,954,455 B2 | 4/2018 | Lin et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang et al. |
| 11,081,193 B1 | 8/2021 | Tang |
| 11,409,323 B2 | 8/2022 | Herberholz et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer et al. |
| 2004/0230396 A1 | 11/2004 | Ye et al. |
| 2005/0053162 A1 | 3/2005 | Goishi |
| 2005/0104175 A1 | 5/2005 | Itano et al. |
| 2005/0114056 A1 | 5/2005 | Patel et al. |
| 2005/0134350 A1 | 6/2005 | Huang et al. |
| 2005/0134394 A1 | 6/2005 | Liu |
| 2005/0154552 A1 | 7/2005 | Stroud et al. |
| 2006/0049886 A1 | 3/2006 | Agostinelli et al. |
| 2006/0224374 A1 | 10/2006 | Kwon |
| 2007/0110199 A1 | 5/2007 | Momtaz et al. |
| 2007/0182456 A1 | 8/2007 | Agarwal et al. |
| 2007/0288183 A1 | 12/2007 | Bulkes et al. |
| 2008/0071489 A1 | 3/2008 | Wissel |
| 2008/0074521 A1 | 3/2008 | Olsen |
| 2008/0144243 A1 | 6/2008 | Mariani et al. |
| 2008/0147355 A1 | 6/2008 | Fields et al. |
| 2008/0183409 A1 | 7/2008 | Roberts et al. |
| 2008/0186001 A1 | 8/2008 | Singh et al. |
| 2008/0186044 A1 | 8/2008 | Singh |
| 2008/0231310 A1 | 9/2008 | Vijayaraghavan et al. |
| 2008/0262769 A1 | 10/2008 | Kadosh et al. |
| 2009/0027077 A1 | 1/2009 | Vijayaraghavan et al. |
| 2009/0076753 A1 | 3/2009 | Vijayaraghavan et al. |
| 2009/0096495 A1 | 4/2009 | Keigo |
| 2009/0183043 A1 | 7/2009 | Niwa |
| 2009/0222775 A1 | 9/2009 | Idgunji et al. |
| 2009/0230947 A1 | 9/2009 | Sumita |
| 2009/0244998 A1 | 10/2009 | Kim |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall et al. |
| 2010/0251046 A1 | 9/2010 | Mizuno et al. |
| 2010/0253382 A1 | 10/2010 | Wang et al. |
| 2011/0093830 A1 | 4/2011 | Chen et al. |
| 2011/0102091 A1 | 5/2011 | Yeric |
| 2011/0109377 A1 | 5/2011 | Fujibe et al. |
| 2011/0113298 A1 | 5/2011 | Van Den Eijnden |
| 2011/0187433 A1 | 8/2011 | Baumann et al. |
| 2011/0267096 A1 | 11/2011 | Chlipala et al. |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0063524 A1 | 3/2012 | Stott et al. |
| 2012/0074973 A1 | 3/2012 | Baldwin et al. |
| 2012/0163074 A1 | 6/2012 | Franca-Neto et al. |
| 2012/0187991 A1 | 7/2012 | Sathe et al. |
| 2012/0212246 A1 | 8/2012 | Benjamin |
| 2012/0217976 A1 | 8/2012 | Clarkson |
| 2012/0221906 A1 | 8/2012 | Shetty et al. |
| 2012/0242490 A1 | 9/2012 | Ramaswami |
| 2013/0088256 A1 | 4/2013 | Chlipala et al. |
| 2013/0226491 A1 | 8/2013 | Emilio et al. |
| 2013/0335875 A1 | 12/2013 | Baumann |
| 2014/0132293 A1 | 5/2014 | Abadir et al. |
| 2014/0132315 A1 | 5/2014 | Sharma et al. |
| 2014/0143586 A1 | 5/2014 | Dalumi et al. |
| 2014/0184243 A1 | 7/2014 | Lyer et al. |
| 2014/0254734 A1 | 9/2014 | Abdelmoneum et al. |
| 2015/0061707 A1 | 3/2015 | Balasubramanian et al. |
| 2015/0077136 A1 | 3/2015 | Li |
| 2015/0121158 A1 | 4/2015 | Wang et al. |
| 2015/0199223 A1 | 7/2015 | Banerjee et al. |
| 2015/0332451 A1 | 11/2015 | Amzaleg et al. |
| 2015/0365049 A1 | 12/2015 | Ozawa et al. |
| 2016/0033574 A1 | 2/2016 | Serrer et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0131708 A1 | 5/2016 | Huang et al. |
| 2016/0153840 A1 | 6/2016 | Huang et al. |
| 2016/0156176 A1 | 6/2016 | Kunz, Jr et al. |
| 2016/0164503 A1 | 6/2016 | Kim et al. |
| 2016/0203036 A1 | 7/2016 | Mezic et al. |
| 2016/0254804 A1 | 9/2016 | Meng |
| 2017/0038265 A1 | 2/2017 | Abdelmoneum et al. |
| 2017/0093399 A1 | 3/2017 | Atkinson et al. |
| 2017/0160339 A1 | 6/2017 | Jenkins |
| 2017/0179173 A1 | 6/2017 | Mandai et al. |
| 2017/0199089 A1 | 7/2017 | Fritchman et al. |

(56) References Cited

U.S. PATENT DOCUMENTS

| | | | |
|---|---|---|---|
| 2017/0199228 | A1 | 7/2017 | Hsieh et al. |
| 2017/0214516 | A1 | 7/2017 | Rivaud et al. |
| 2017/0329391 | A1 | 11/2017 | Jaffari et al. |
| 2017/0344102 | A1 | 11/2017 | Kolla et al. |
| 2017/0345490 | A1 | 11/2017 | Yoshimoto et al. |
| 2017/0364818 | A1 | 12/2017 | Wu et al. |
| 2018/0034549 | A1 | 2/2018 | Kikuchi |
| 2018/0183413 | A1 | 6/2018 | Wong et al. |
| 2018/0365974 | A1 | 12/2018 | Haas et al. |
| 2019/0019096 | A1 | 1/2019 | Yoshida et al. |
| 2019/0117122 | A1 | 4/2019 | Kurachi et al. |
| 2019/0187204 | A1* | 6/2019 | Doescher ............ G01R 31/2856 |
| 2019/0305074 | A1 | 10/2019 | Kande et al. |
| 2020/0028514 | A1 | 1/2020 | Hanke et al. |
| 2020/0203333 | A1 | 6/2020 | Chen et al. |
| 2021/0181251 | A1* | 6/2021 | Hsieh ...................... G01R 27/28 |
| 2022/0260630 | A1 | 8/2022 | Fayneh et al. |
| 2022/0349935 | A1 | 11/2022 | Fayneh et al. |
| 2022/0349938 | A1* | 11/2022 | Vezyrtzis ............. H03K 3/0315 |
| 2023/0098071 | A1 | 3/2023 | Chonnad et al. |

FOREIGN PATENT DOCUMENTS

| | | | |
|---|---|---|---|
| CN | 102273077 | B | 9/2014 |
| CN | 102422169 | A | 11/2014 |
| CN | 105210188 | A | 12/2015 |
| CN | 106959400 | A | 7/2017 |
| CN | 108534866 | A | 9/2018 |
| CN | 113466670 | A | 10/2021 |
| DE | 102012219971 | A1 | 7/2016 |
| EP | 2006784 | A1 | 12/2008 |
| EP | 2060924 | A1 | 5/2009 |
| EP | 2413150 | A1 | 2/2012 |
| JP | 2000215693 | A | 8/2000 |
| JP | 2002243800 | A | 8/2002 |
| JP | 2008147245 | A | 6/2008 |
| JP | 2009021348 | A | 1/2009 |
| JP | 2009065533 | A | 3/2009 |
| KR | 2013110989 | A | 10/2013 |
| KR | 20150073199 | A | 6/2015 |
| TW | 200914841 | A | 4/2009 |
| TW | 201614256 | A | 3/2016 |
| TW | 201709669 | A | 3/2017 |
| WO | 2005080099 | A1 | 9/2005 |
| WO | 2013027739 | A1 | 3/2015 |
| WO | 2019097516 | A1 | 5/2019 |
| WO | 2019102467 | A1 | 5/2019 |
| WO | 2019135247 | A1 | 7/2019 |
| WO | 2019202595 | A1 | 10/2019 |
| WO | 2019244154 | A1 | 12/2019 |
| WO | 2020141516 | A1 | 7/2020 |
| WO | 2020230130 | A1 | 11/2020 |
| WO | 2021019539 | A1 | 2/2021 |
| WO | 2021111444 | A1 | 6/2021 |
| WO | 2021214562 | A1 | 10/2021 |
| WO | 2022/009199 | A1 | 1/2022 |
| WO | 2022215076 | A1 | 10/2022 |
| WO | 2023084528 | A1 | 5/2023 |
| WO | 2023084529 | A1 | 5/2023 |
| WO | 2023144817 | A1 | 8/2023 |
| WO | 2023238128 | A1 | 12/2023 |

OTHER PUBLICATIONS

Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.

Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.

Shidhartha Das et al, "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.

Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.

Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.

Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.

Matthew Fojtik et al, "Bubble Razor: An architecture-independent approach to timing-error detection and correction"; 2012 IEEE International Solid-State Circuits Conference; Feb. 19-23, 2012. doi: 10.1109/ISSCC.2012.6177103.

Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.

Piero Franco et al, "On-Line Delay Testing of Digital Circuits"; Proceedings of IEEE VLSI Test Symposium; Apr. 25-28, 1994. doi: 10.1109/VTEST.1994.292318.

V. Huard et al, "Adaptive Wearout Management with in-situ aging monitors"; 2014 IEEE International Reliability Physics Symposium; Jun. 1-5, 2014. pp. 6B.4.1-6B.4.11, doi: 10.1109/IRPS.2014.6861106.

Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.

M. Saliva et al, "Digital Circuits Reliability with In-Situ Monitors in 28nm Fully Depleted SOI"; 2015 Design, Automation Mar. 9-13, 2015. doi: 10.7873/DATE.2015.0238.

Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.

Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.

Martin Wirnshofer et al, "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.

S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.

A. Benhassain et al, "Early failure prediction by using in-situ monitors: Implementation and application results"; Online at: https://ceur-ws.org/Vol-1566/Paper6.pdf, Mar. 18, 2016.

Charles R. Lefurgy et al, "Active Management of Timing Guardband to Save Energy in POWER7"; 2011 44th Annual IEEE/ACM International Symposium on Microarchitecture (MICRO); pp. 1-11; Dec. 3-7, 2011.

C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.

B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.

M. Cho et al., "Postsilicon Voltage Guard-Band Reduction in a 22 nm Graphics Execution Core Using Adaptive Voltage Scaling and

(56) References Cited

OTHER PUBLICATIONS

Dynamic Power Gating"; in IEEE Journal of Solid-State Circuits, vol. 52, No. 1, pp. 50-63, Jan. 4, 2017. doi: 10.1109/JSSC.2016.2601319.

W. Shan et al, "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.

J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.

X. Shang et al, "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.

Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.

Martin Wirnshofer et al, "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.

Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.

Youhua Shi et al, "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition (DATE), pp. 511-516, Mar. 14-18, 2016. doi: 10.1109/APCCAS.2014.7032886.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Dan Ernst et al; "Razor: Circuit-Level Correction of Timing Errors for Low-Power Operation"; IEEE Computer Society. Nov. 30, 2004.

Dan Ernst et al; "Razor: A Low-Power Pipeline Based on Circuit-Level Timing Speculation"; Appears in the 36th Annual International Symposium on Microarchitecture (MICRO-36). Dec. 1, 2003.

James P. Hofmeister, et al, "Ball Grid Array (BGA) Solder Joint Intermittency Detection: SJ BIST™", IEEE Aerospace Conference Proceedings, Apr. 2008, paper #1148, Version 1.

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011.

Weiwei Shan et al. "An improved timing error prediction monitor for wide adaptive frequency scaling"; IEICE Electronics Express, vol. 14, No. 21, pp. 1-6, Oct. 20, 2017.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014.

Basab Datta at al; "Analysis of a Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006.

Sandeep Kumar Samal et al; "Machine Learning Based Variation Modeling and Optimization for 3D ICs"; J. Inf. Commun. Converg. Eng. 14(4): 258-267, Dec. 2016.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled Ltps TFT Circuits for Low-Power Low-Cost Applications"; IEEE Transactions on Computer-Aided Design of Integrated Circuits and Systems, vol. 28(1): 46-59, Jan. 1, 2009.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014.

Rebaud B et al , "Timing slack monitoring under process and environmental variations: Application to a DSP performance optimization"; Microelectronics Journal vol. 42 Issue 5, pp. 718-732, Feb. 8, 2011.

Dierickx B et al, "Propagating variability from technology to system Level"; Physics of Semiconductor Devices, pp. 74-79, Dec. 16, 2007.

Zheng K., "A Comparison of Digital Droop Detection Techniques in ASAP7 FinFET"; Research Review. Sep. 2019.

Hongge Chen, "Novel Machine Learning Approaches for Modeling Variations in Semiconductor Manufacturing," Master thesis, Jun. 2017.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014.

I. A. K. M. Mahfuzul et al, "Variation-sensitive monitor circuits for estimation of Die-to-Die process variation"; 2011 IEEE ICMTS International Conference on Microelectronic Test Structures; pp. 153-157, Apr. 4-7, 2011.

Ying Qiao et al, "Variability-aware compact modeling and statistical circuit validation on SRAM test array"; Proceedings vol. 9781, Design-Process-Technology Co-optimization for Manufacturability X, Mar. 16, 2016.

David Herres, "The Eye Diagram: What is it and why is it used?"; Online at: https://www.testandmeasurementtips.com/basics-eye-diagrams/, Aug. 16, 2016.

(56) References Cited

OTHER PUBLICATIONS

Yu-Chuan Lin et al, "A 10-Gb/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020.
PCT International Search Report for International Application No. PCT/IL2019/050039, mailed May 7, 2019, 6pp.
PCT Written Opinion for International Application No. PCT/IL2019/050039, mailed May 7, 2019, 5pp.
PCT International Preliminary Report on Patentability for International Application No. PCT/IL2019/050039, issued Jul. 14, 2020, 6pp.

\* cited by examiner

INTEGRATED CIRCUIT WORKLOAD, TEMPERATURE, AND/OR SUB-THRESHOLD LEAKAGE SENSOR

CROSS REFERENCE TO RELATED APPLICATIONS

This application is a continuation of U.S. patent application Ser. No. 17/703,438, entitled "Integrated Circuit Degradation Estimation and Time-of-Failure Prediction Using Workload and Margin Sensing," filed Mar. 24, 2022, which (a) claims the benefit of U.S. Provisional Patent Application No. 63/279,373, entitled "Integrated Circuit Simulator for Degradation Estimation and Time-of-Failure Prediction," filed Nov. 15, 2021, and (b) is a continuation-in-part of U.S. patent application Ser. No. 16/960,421, entitled "Integrated Circuit Workload, Temperature And/Or Sub-Threshold Leakage Sensor," filed Jul. 7, 2020, now U.S. Pat. No. 11,408,932, which is a national phase of PCT Patent Application No. PCT/IL2019/050039, entitled "Integrated Circuit Workload, Temperature And/Or Sub-Threshold Leakage Sensor," filed Jan. 8, 2019, which claims the benefit of priority of U.S. Provisional Patent Application No. 62/614,706, entitled "Integrated Circuit Sub-Threshold Leakage Sensor," filed Jan. 8, 2018.

The contents of all the above applications are incorporated herein by reference in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs. Digital ICs contain billions of transistors, such as metal-oxide-semiconductor field-effect transistor (MOSFETs), arranged in functional and/or logical units on the wafer, with datapaths interconnecting the functional units that transfer data values between the functional units. Each unit has a power source and an associated on power, off power, standby power, and the like.

Digital ICs implement a large number of CMOS-based sub-circuits, each sub circuit associated with an OFF configuration. During the OFF configuration, power may still be consumed by the sub-circuit devices, such as often called static-power consumption. The static (or leakage) power of all the sub-circuits within an IC is summed and may be called the total IC static power.

In digital ICs, sub-threshold leakage may be considered a parasitic leakage in a state that would ideally have no current. Conversely, in micropower analog circuits, weak inversion is an efficient operating region, and subthreshold may be a useful transistor mode around which circuit functions may be designed. Measuring or tracking leakage current and other operational characteristics of the functional units or IC, such as temperature, is therefore desirable.

"Analysis of a Ring Oscillator Based on Chip Thermal Sensor in 65 nm Technology" Datta, Kumar (published on http://archive.vn/IoDq) discusses the dependence of delay in a ring oscillator on temperature. Inverter delay normally increases with temperature, such that the ring oscillator frequency reduces with increasing temperature. A chip thermal sensor is proposed based on this principle. It is also suggested that leakage power for the entire chip may be determined using such a sensor. Such sensors have not been considered accurate though, in part because the temperature sensitivity may be a consequence of the process technology of the inverters used in the ring oscillator.

The degradation of an IC's transistors and other components over time is termed 'aging.' For example, the degradation of transistors over time leads slowly to decreased switching speeds, and may even result in outright circuit failures, when they exceed the design safety factors. Usually, the design process incorporates these delays into the design such that the ICs will not fail during their normal lifetime, but environmental and usage conditions (such as increased temperature, voltage, current, humidity, and/or the like) may accelerate the aging process.

IC transistors, such as bipolar transistors, metal-oxide semiconductor field-effect transistors (MOSFETs), and/or the like, may be used in digital ICs and may function as electrical switches. For example, a MOSFET may have four terminals, such as the body, the gate, the source, and the drain, yet typically the source and body are electrically connected. The voltage applied to the gate may determine the amount of current that flows between the source and drain. A thin layer of dielectric material electrically insulates the gate, and the electric field applied across the gate may alter the conductivity of the underlying semiconductor channel between the source and drain.

Various physical degradation (aging) phenomena may affect IC transistors:

With use, charge carriers (such as electrons for n-channel MOSFETs, or holes for p-channel MOSFETs) that have more energy than the average charge carrier may stray out of the conductive channel between the source and drain, and become trapped in the insulating dielectric. This phenomenon, termed 'hot-carrier injection' (HCI), may eventually build up electric charge within the dielectric layer, and thus increase the voltage needed to operate the transistor. As the threshold voltage increases, the transistor switching delay may become larger.

Another degradation phenomenon, termed 'bias temperature instability' (BTI). occurs when voltage is applied to the gate. BTI may cause a buildup of charge in the dielectric, most of which spontaneously disappears after that gate voltage is removed. This recovery occurs within a few microseconds but leaves small, remaining effects that can be typically measured only after the stress is removed.

Yet another degradation phenomenon comes into play when voltage applied to the gate creates electrically-active defects, known as 'traps,' within the dielectric. When traps become too numerous, they may combine and form an outright short circuit between the gate and the current channel. This kind of failure is termed 'oxide breakdown,' or 'time-dependent dielectric breakdown' (TDDB). Unlike the other aging mechanisms, which cause a gradual decline in performance, the breakdown of the dielectric may lead to a catastrophic failure of the transistor, causing the IC to malfunction.

Additionally, a degradation phenomenon called 'electromigration' (EM) may damage the copper or aluminum connections that tie transistors together or link them to the outside world. Electromigration may occur when a surge of current knocks metal atoms loose from the electrical connections, and may cause them to flow with the electrons. This depletes the metal of some atoms upstream, while causing a buildup of metal downstream. The upstream thinning of the metal increases the electrical resistance of the connection, sometimes even becoming an open circuit. The downstream deposition may cause the metal to bulge out of its designated track.

Additionally, any manufacturing defect or unmodeled phenomenon may cause a timing degradation of a data path over time. Some defects may not even appear during testing, verification, initial operation, etc. For example, a via with a manufacturing defect, such as less than complete metal coverage, will increase its resistance over time and at some point cause a timing violation of a logic path. Furthermore, random manufacturing defects may appear anywhere on the IC and be manifested in a large variety of types and magnitudes, so designers may not be able to incorporate safety factors to mitigate these defects in advance.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a semiconductor integrated circuit (IC) comprising: a functional transistor, having an output providing an electrical current; a ring oscillator (ROSC) circuit, located in the IC proximate to the functional transistor and having an oscillation frequency in operation; and a processor, configured to determine one or more operating conditions of the functional transistor based on the oscillation frequency of the ROSC. Advantageously, the ROSC has an input coupled to receive the electrical current from the output of the functional transistor.

In embodiments, the semiconductor IC further comprises: an enabling part, configured to enable or disable the ROSC in accordance with a received enable signal. Optionally, the enabling part comprises a NAND logic gate as part of the ROSC, a first input of the NAND logic gate being arranged to receive the enable signal and a second input of the NAND logic gate being coupled to an output of the ROSC.

In embodiments, the ROSC comprises at least one skewed inverter.

In embodiments, the processor is configured to use stored simulation results for the oscillation frequency of the ROSC at different operating conditions to determine the one or more operating conditions of the functional transistor.

In embodiments, the ROSC forms part of at least one leakage detection circuit, for instance such that the processor is configured to determine a leakage current for the functional transistor based on the oscillation frequency of the ROSC. Optionally, the at least one leakage detection circuit comprises a sub-threshold bias generator electrically connected to the input voltage of a device under test (DUT), in which the DUT preferably comprises the functional transistor. Then, the ROSC is preferably a first storage circuit that is electrically connected to an output of the DUT. Optionally, the at least one leakage detection circuit comprises an electronic switch electrically connected to the output of the DUT, such as a drain of the functional transistor. The at least one leakage detection circuit advantageously comprises a frequency measurement circuit.

In some embodiments, the at least one leakage detection circuit is a plurality of leakage detection circuits, each measuring the leakage current from one of a plurality of DUTs.

In embodiments, the ROSC and the processor form part of at least one temperature detection circuit, such that the processor is configured to determine a temperature for the functional transistor based on the oscillation frequency of the ROSC. Optionally, the processor is further configured to use stored simulation results for the oscillation frequency of the ROSC at different temperatures to determine the temperature of the functional transistor based on the oscillation frequency of the ROSC. Optionally, the processor is further configured to identify the IC as having a type selected from a group consisting of a plurality of predefined types of IC, the processor storing respective simulation results for the oscillation frequency of the ROSC at different temperatures for each of the predefined types. Optionally, the at least one temperature detection circuit further comprises a current source, an output of the current source providing an input to the ROSC. Optionally, the current source comprises a sub-threshold bias generator coupled to a control terminal of the functional transistor and configured to bias the functional transistor in a sub-threshold state, an output of the functional transistor providing the output of the current source. The sub-threshold bias generator may form part of the at least one leakage detection circuit as herein described. Advantageously, the at least one temperature detection circuit is configured such that the oscillation frequency of the ROSC increases with increasing temperature.

In embodiments, the processor is configured to determine a stress or workload for the IC based on the oscillation frequency of the ROSC. Optionally, the stress or workload for the IC is determined based on a function of one or more of: IC voltage; temperature; and IC activity. Optionally, the processor is further configured to determine the stress or workload at different values of one or both of: a clock frequency for the semiconductor IC; and an operating voltage for semiconductor IC, the processor being configured to provide the stress or workload referenced against the clock frequency and/or operating voltage. Optionally, the stress or workload for the IC represents an aggregate stress or workload over a time interval, the time interval being based on a time duration for measurement of the oscillation frequency of the ROSC. Optionally, the stress or workload for the IC represents an aggregate stress or workload against temperature. Optionally, the stress or workload is represented by one or more of: a number; a ratio with respect to a reference value for all semiconductor ICs; and a ratio with respect to a reference value for semiconductor ICs of the same type. Optionally, the processor is further configured to receive a margin loss for the semiconductor IC and correlate the received margin loss with the stress or workload. Optionally, the processor is further configured to determine a margin loss for the IC based on the determined stress or workload and a stored correlation between stress or workload and margin loss. Optionally, the processor is further configured to selectively enable or disable a Negative-bias temperature instability (NBTI) mode for at least a portion of the semiconductor IC and determine a stress or workload for the NBTI mode when the NBTI mode is enabled. Optionally, the processor is further configured to generate a notification signal based on a comparison of the determined stress or workload with a predetermined criterion, the notification signal being indicative of one or more of: a state or age of the IC; one or more guard-bands for the IC; and a maintenance or replacement condition.

In embodiments, the processor is configured to determine multiple instances of the one or more operating conditions spread over a time period and to store the determined multiple instances of the one or more operating conditions.

In embodiments, the processor is configured to store the determined multiple instances of the one or more operating conditions in one or more of: a non-volatile memory in the semiconductor IC; an external storage device on a local system; and an external storage device on a remote system over a network. Optionally, the processor is configured to determine an aggregate value for the determined multiple instances of the one or more operating conditions over the time period.

In embodiments, the input of ROSC is switchably coupled to receive the electrical current from the output of the functional transistor, such that the processor is configured to determine: a reference frequency based on the oscillation frequency of the ROSC when the input of ROSC does not receive the electrical current from the output of the functional transistor; and a sensor measurement frequency based on the oscillation frequency of the ROSC when the input of ROSC receives the electrical current from the output of the functional transistor.

There is provided, in accordance with an embodiment, a method for determining one or more operating conditions of a functional transistor in a semiconductor integrated circuit (IC). The method comprises: measuring an oscillation frequency at the output of a ring oscillator (ROSC) located in the IC proximate to the functional transistor; determining one or more operating conditions of the functional transistor based on the oscillation frequency of the ROSC. Advantageously, the ROSC receives an electrical current from an output of the functional transistor as an input.

In embodiments, the method further comprises switching to enable or disable the ROSC in accordance with an enable signal. In embodiments, the step of determining uses stored simulation results for the oscillation frequency of the ROSC at different operating conditions to determine the one or more operating conditions of the functional transistor.

In embodiments, the step of determining comprises determining (or detecting) a leakage current from the semiconductor IC, in particular for the functional transistor, based on the oscillation frequency of the ROSC. The functional transistor is beneficially comprised in a device under test (DUT). The method optionally comprises the action of measuring a frequency at the output of a ring oscillator (ROSC) as a reference frequency. The method preferably comprises the action of setting a sub-threshold voltage on an input voltage lead of the at least one DUT using a sub-threshold bias generator electrically connected to the input voltage lead. The method comprises the action of measuring a frequency at the output of the ROSC as a leakage frequency. The method comprises the action of computing a leakage current using a computing device, advantageously based on the leakage frequency. The method optionally comprises the action of closing an electronic switch electrically connected between an output (drain) lead of the at least one DUT and the ROSC. Optionally, the method further comprises: measuring an oscillation frequency at the output of a ring oscillator (ROSC) as a reference frequency, an electronic switch electrically connected between an output of the DUT and the ROSC being set as open during the measurement; and closing the electronic switch prior to the step of measuring a frequency at the output of the ROSC as a leakage frequency.

In embodiments, the method further comprises: determining a temperature of the functional transistor based on the oscillation frequency of the ROSC. Optionally, the step of determining a temperature of the functional transistor is based on the oscillation frequency of the ROSC and stored simulation results for the oscillation frequency of the ROSC at different temperatures. Optionally, the method further comprises: identifying the IC as having a type selected from a group consisting of a plurality of predefined types of IC, the step of determining a temperature further comprising selecting from stored respective simulation results for the oscillation frequency of the ROSC at different temperatures for each of the predefined types, based on the identification. Optionally, the method further comprises: providing an output of a current source as an input to the ROSC. Optionally, the method further comprises setting a sub-threshold voltage on an input voltage lead of the functional transistor using a sub-threshold bias generator electrically connected to the input voltage lead, such that an output of the functional transistor provides the output of the current source.

In embodiments, the one or more operating conditions comprise a stress or workload for the IC, the stress or workload being determined based on the oscillation frequency of the ROSC. Optionally, the stress or workload for the IC is determined based on a function of one or more of: IC voltage; temperature; and IC activity. Optionally, the step of determining comprises determining the stress or workload at different values of one or both of: a clock frequency for the semiconductor IC; and an operating voltage for semiconductor IC, the method further comprising providing the stress or workload referenced against the clock frequency and/or operating voltage. Optionally, the stress or workload for the IC represents an aggregate stress or workload over a time interval, the time interval being based on a time duration for measurement of the oscillation frequency of the ROSC. Optionally, the stress or workload is represented by one or more of: a number; a ratio with respect to a reference value for all semiconductor ICs; and a ratio with respect to a reference value for semiconductor ICs of the same type. Optionally, the method further comprises determining a reliability margin or margin loss for the IC based on the determined stress or workload and a stored correlation between stress or workload and margin loss. Optionally, the method, further comprises: selectively enabling or disabling a Negative-bias temperature instability (NBTI) mode for at least a portion of the semiconductor IC; and preferably, determining a stress or workload for the NBTI mode when the NBTI mode is enabled. Optionally, the method further comprises: comparing the determined stress or workload with a predetermined criterion. Preferably, the predetermined criterion is based on a statistical lifetime workload for semiconductor ICs of the same type as the semiconductor IC. Optionally, the method further comprises: generating a notification signal based on the comparison, the notification signal being indicative of one or more of: a state or age of the IC; one or more guard-bands for the IC; and a maintenance or replacement condition.

In embodiments, the method further comprises: determining a plurality of sets of stress or workload for the IC, each set of stress or workload being determined from ROSC oscillation frequencies occurring during operation of a respective application by the semiconductor IC. Optionally, each set of stress or workload comprises multiple instances of stress or workload, spread over a time period.

In embodiments, the method further comprises: correlating the stress or workload with a margin loss for the semiconductor IC. Optionally, the method further comprises: calibrating test results for the semiconductor IC based on the stress or workload.

In embodiments, the method further comprises: determining multiple instances of the one or more operating conditions spread over a time period; and storing the determined multiple instances of the one or more operating conditions. Optionally, the step of storing the determined multiple instances of the one or more operating conditions is in one or more of: a non-volatile memory in the semiconductor IC; an external storage device on a local system; and an external storage device on a remote system over a network. Optionally, the method further comprises: determining an aggregate value for the determined multiple instances of the one or more operating conditions over the time period.

In embodiments, the method further comprises: switchably coupling the input of the ROSC to receive the electrical current from the output of the functional transistor; determining a reference frequency based on the oscillation frequency of the ROSC when the input of ROSC does not receive the electrical current from the output of the functional transistor; and/or determining a sensor measurement frequency based on the oscillation frequency of the ROSC when the input of ROSC receives the electrical current from the output of the functional transistor.

Advantageously, the step of determining one or more operating conditions is performed at a computing device. In some embodiments, the computing device is or comprises a circuit on the IC. Additionally or alternatively, the computing device is or comprises an external device to the semiconductor IC. In the latter case, the method may further comprise receiving, by the computing device, a plurality of oscillation frequencies and wherein the determining is performed using a fitted function taking as input the plurality of oscillation frequencies. Optionally, the method further comprises receiving, by the computing device, a plurality of oscillation frequencies each from a respective one of a plurality of ICs. In some embodiments, the method further comprises sending the reference frequency and the sensor (e.g. leakage) frequency to the computing device.

In some embodiments, the method further comprises receiving, by the computing device, a plurality of reference frequencies and a corresponding plurality of sensor (leakage) frequencies, and wherein the computing is performed using a fitted function taking as input the plurality of reference frequencies and the corresponding plurality of sensor (leakage) frequencies.

In some embodiments, the method further comprises receiving, by the computing device, a plurality of frequency pairs from a plurality of ICs, wherein each of the plurality of frequency pairs comprises a reference and sensor (leakage) frequency.

There is further provided, in accordance with an embodiment, an IC comprising: a margin measurement circuit configured to monitor multiple data paths of the IC and to output, at different times, different ranges of remaining margins of the multiple data paths; a workload sensor configured to output a value representing aggregate operational stress experienced by the IC over a period of time ending at each of the different times; and a processor configured to: (i) compute, based on the value output by said workload sensor, an upper bound and a lower bound of change of the remaining margin of the IC, and (ii) compute upper and lower bounds of a current remaining margin of the IC, based on (a) the upper and lower bounds of change, and (b) a remaining margin indicated by a border between two adjacent ranges outputted by the margin measurement circuit.

There is further provided, in accordance with an embodiment, a computer-implemented method comprising: receiving timing data of multiple data paths of an integrated circuit (IC) design; simulating degradation of the multiple data paths over a period of time, wherein the timing data serve as a baseline of the simulated degradation, and wherein the simulation comprises: (i) simulating an effect of at least one physical degradation phenomenon on the multiple data paths, wherein the at least one physical degradation phenomenon is selected from the group consisting of: negative-bias temperature instability (NBTI), hot carrier injection (HCI), electromigration (EM), and time-dependent dielectric breakdown (TDDB), (ii) simulating operation of a margin measurement circuit which is embedded in the IC design and monitors the multiple data paths, wherein the margin measurement circuit, in its simulated operation, outputs a time series of different ranges of remaining margins of the multiple data paths, (iii) simulating operation of a workload sensor which is embedded in the IC design, wherein the workload sensor, in its simulated operation, outputs a time series of values each representing aggregate operational stress experienced by the IC design given simulated operational conditions that comprise temperature and voltage, (iv) computing, based on each of the values output by the workload sensor, an upper bound and a lower bound of change of the remaining margin of the IC design, and (v) computing upper and lower bounds of a current remaining margin of the IC design, based on (a) the upper and lower bounds of change, and (b) a remaining margin indicated by a border between two adjacent ranges outputted by the margin measurement circuit; and based on the simulated degradation, estimating at least one of: degradation of the multiple data paths over the period of time, and a predicted time of failure of the IC design due to a timing violation by a worst-performing data path of the multiple data paths.

In some embodiments, the processor is further configured to, or the method further comprises, based on the computed upper and lower bounds of the current remaining margin, estimate at least one of: degradation the multiple data paths, and a predicted time of failure of the IC due to a timing violation by a worst-performing data path of the multiple data paths.

In some embodiments, the computing of the upper and lower bounds of change comprises: computing possible workload values respective of voltage and temperature corners of the IC; computing possible acceleration factor values respective of the voltage and temperature corners; based on the possible workload values and the possible acceleration factor values, computing an operational envelope of the IC; based on the operational envelope and the value output by the workload sensor, computing an upper bound of an acceleration factor and a lower bound of the acceleration factor; and based on the upper and lower bounds of the acceleration factor and on the remaining margin indicated by the border between two adjacent ranges, computing the upper and lower bounds of change.

In some embodiments, at least one of the degradation and the predicted time of failure is estimated based on the computed upper and lower bounds of the change in the remaining margin.

In some embodiments, the upper and lower bounds of the current remaining margin are narrower than each of the ranges of remaining margin which are output by the margin measurement circuit.

In some embodiments, the margin measurement circuit comprises: a signal combiner configured to combine signals from the multiple data paths; a signal splitter configured to split the combined signals into two test paths; a delay circuit configured to gradually apply varying levels of delay to signals passing through a first one of the two test paths; and a comparation circuit configured to determine the range of remaining margin of the multiple data paths, based on a comparison between signals from the first test path and from a second one of the two test paths.

In some embodiments, the workload sensor comprises: a functional transistor, having an output providing an electrical current; a ring oscillator (ROSC) circuit: located proximate to the functional transistor, having an oscillation frequency in operation, and having an input coupled to receive the electrical current from the output of the functional transistor; and a processor, configured to determine one or more operating conditions of the functional transistor based on the oscillation frequency of the ROSC circuit.

In addition to the exemplary aspects and embodiments described above, further aspects and embodiments will become apparent by reference to the figures and by study of the following detailed description. Moreover, the various features and embodiments of the invention described above are specifically contemplated to be used alone as well as in various combinations.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
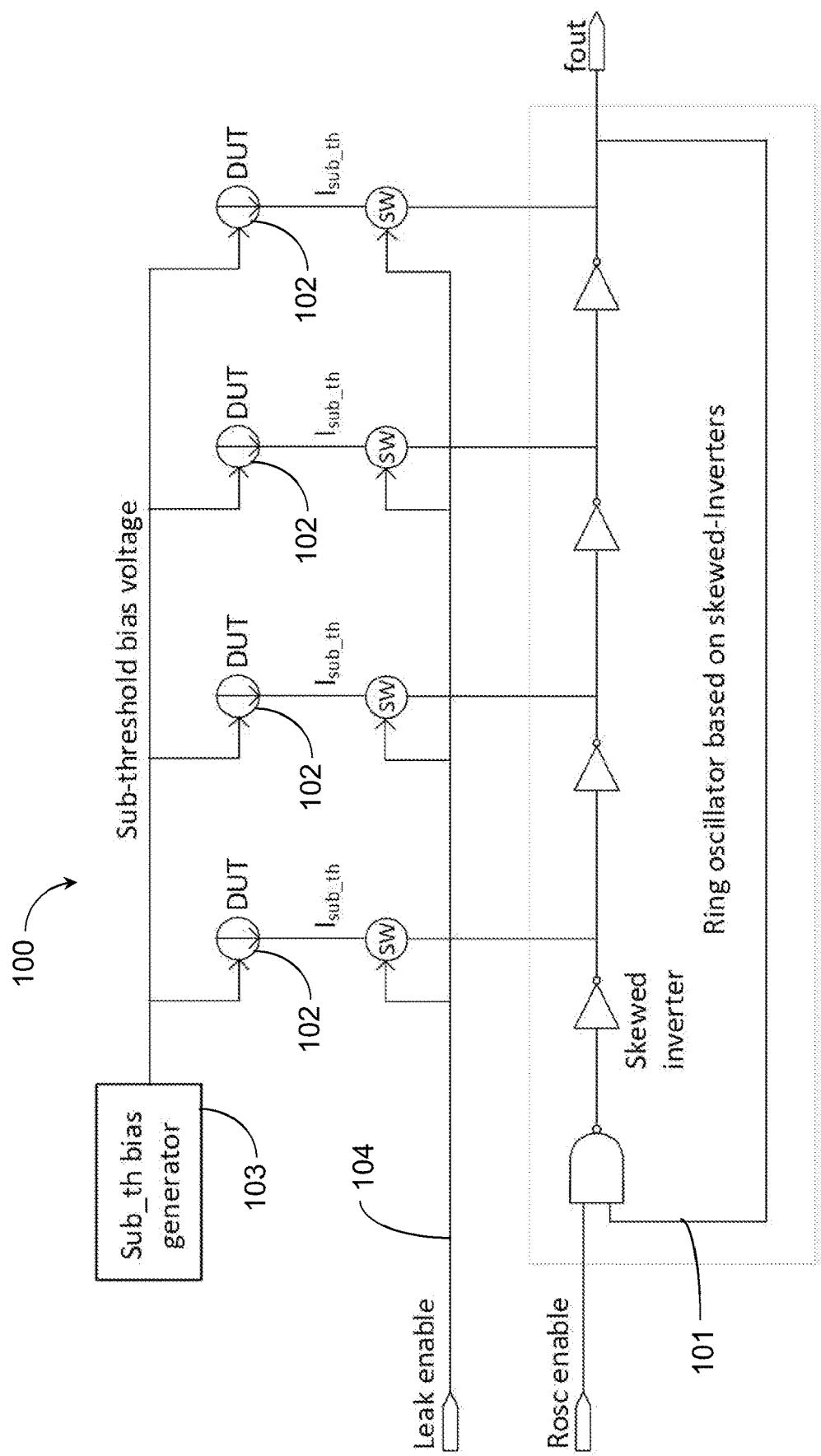
FIG. 1 shows schematically a high-level block diagram of a sensing circuit for IC power leakage detection.

Disclosed are IC sensors for determining operational characteristics of the IC or for simulating such characteristics, such as one or more on-die sensors, that identify and/or characterize one or more functional transistors (such as PMOS and/or NMOS transistors) located at different locations on the die. The sensor is an electronic circuit on the die (or in its pre-fabrication design) that measures (or simulates measurement of) a characteristic or characteristics of a section of the die, such as a device under test (DUT), into a frequency change that may be measured. In particular, such sensors are based on a ring oscillator circuit, the frequency of which changes in accordance with the operational characteristic or characteristics being measured, such as leakage current and/or workload (also termed "stress") of the IC. The ring oscillator receives current (in particular, a leakage current) as an input from the functional transistor (or transistors).

Also disclosed is a margin measurement circuit that is embedded in a fabricated IC or in its pre-fabrication design, to monitor multiple data paths. Once every predefined period of time, the margin measurement circuit outputs a value of the worst-case remaining margin of the data paths. Generally, the margin measurement circuit may include the following main components: A signal combiner configured to combine signals from the multiple data paths into a single signal; a signal splitter configured to split the combined signal into two test paths; a delay circuit configured to gradually apply varying levels of delay to signals passing through a first one of the two test paths; a comparation circuit configured to determine the worst-case remaining margin of the multiple data paths, based on a comparison between the first test path and a second one of the two test paths performed at every level of delay.

Further disclosed is a way to fuse workload and margin readings of the above sensors and circuits in order to enhance estimation of degradation of an IC, whether during simulation or field operation. This may result in a degradation curve of the IC over time, a predicted time of failure of the IC, etc.

In one example, an IC leakage sensor is provided, such as one or more on-die leakage sensors, which identify and/or characterize a sub-threshold leakage current of PMOS and/or NMOS transistors located at different locations on the die. The sensor is an electronic circuit on the die that converts the leakage current from a section of the die, such as a device under test (DUT), into a frequency change that may be measured, so that a leakage current may be calculated, and the leakage current value represented as a digital read-out. The leakage sensor(s) may detect n-channel MOSFETs (NMOSs) leakage and p-channel MOSFETs (PMOS) leakage separately.

Another example provides a sensor that detects temperature. An IC temperature sensor, such as one or more on-die temperature sensors, identify and/or characterize a temperature of PMOS and/or NMOS transistors located at different locations on the die. The sensor is an electronic circuit on the die that converts the temperature at a section of the die into a frequency change that may be measured, optionally a temperature calculated, and also optionally the temperature value represented as a digital read-out. The temperature sensor is based on a ring oscillator with current (in particular, a leakage current) provided as an input from a proximate functional transistor (or transistors). This current changes the dependence of the ring oscillator frequency on temperature. By adding the current, the temperature dependence becomes more accurate.

A similar example provides a sensor that detects workload or stress on a part or whole of the IC. An IC workload sensor, such as one or more on-die workload sensors may be based on the temperature sensor, but can identify and/or characterize a workload or stress at different locations on the die, calculate a workload, which may be represented as a digital read-out.

Optionally, the analysis of the sensor data is performed using IC profiling, IC classification, machine learning of IC power consumption (i.e. from single and multiple ICs), and/or the like.

In general terms, there may be considered a semiconductor integrated circuit (IC) comprising: a functional transistor, having an output providing an electrical current; a ring oscillator (ROSC) circuit, located in the IC proximate to the functional transistor and having an oscillation frequency in operation; and a processor, configured to determine one or more operating conditions of the functional transistor based on the oscillation frequency of the ROSC. Advantageously, the ROSC has an input coupled to receive the electrical current (such as a leakage current) from the output of the functional transistor. There may equivalently be considered a method for determining one or more operating conditions of a functional transistor in a semiconductor IC. An oscillation frequency is measured at the output of a ROSC located in the IC proximate to the functional transistor. One or more operating conditions of the functional transistor are determined based on the oscillation frequency of the ROSC. Advantageously, the ROSC receives an electrical current from an output of the functional transistor as an input. Any of the features disclosed herein may be considered with reference to the semiconductor IC and/or a method accordingly.

In embodiments, enabling part is configured to enable or disable the ROSC in accordance with a received enable signal. For example, the enabling part may comprise a NAND logic gate as part of the ROSC, a first input of the NAND logic gate being arranged to receive the enable signal and a second input of the NAND logic gate being coupled to an output of the ROSC. A switch may be provided to control supply of the (leakage) current from the functional transistor. The ROSC optionally comprises at least one skewed inverter. This may increase the sensitivity of the tested device, since the sensor (such as the ROSC configuration) may be specific to a functional transistor type (for example an n-device or p-device).

In embodiments. the processor is configured to use stored simulation results for the oscillation frequency of the ROSC at different operating conditions to determine the one or more operating conditions of the functional transistor.

The one or more operating conditions may be determined using a computing device, which may be a circuit on the semiconductor IC and/or an external device to the semiconductor IC. Where the computing device is an external device to the semiconductor IC, the computing device may receive a plurality of oscillation frequencies, for instance each from a respective one of a plurality of different locations on the same and/or each from one of a plurality of different ICs.

The determining may then be performed using a fitted function taking as input the plurality of oscillation frequencies.

The input of the ROSC may be switchably coupling to receive the electrical current from the output of the functional transistor (such that the coupling may be selectively made or not made). Then, a reference frequency may be determined based on the oscillation frequency of the ROSC when the input of ROSC does not receive the electrical current from the output of the functional transistor. A sensor measurement frequency may be determined based on the oscillation frequency of the ROSC when the input of ROSC receives the electrical current from the output of the functional transistor.

Specific implementations will now be discussed, but further reference to the generalized sense will be made below.

Leakage Sensor

Reference is now made to FIG. 1, which shows schematically a high-level block diagram of a sensing circuit 100 for IC power leakage detection. Sensing circuit 100 includes a ring-oscillator (ROSC) 101 that is based on a skewed inverter. The sensing circuit tests one or more DUTs 102 that are implemented as a PMOS or an NMOS transistor. The sensing circuit includes a sub-threshold bias generation circuit 103, and leak enable switches (enabled by an enable lead 104) that electrically connects the leakage current from the DUTs into the oscillator internal nodes. The leakage current is measured at two steps:

1. The switch is open, the oscillator frequency is measured at no leakage condition and this value is used as a reference measurement.
2. The switch is closed, and the leakage current of the DUTs are electrically connected to the oscillator internal nodes. The frequency of the oscillator may change in direct proportion to the leakage current amplitude.

The ratio between the two measurements may be calculated and may be proportional to the DUTs sub-threshold leakage current amplitude. The reference measurement of step-1 may be used to adjust the frequency measurements for other effects, such as channel-length variation, to detect the DUTs sub-threshold leakage. The reference frequency may also be adjusted for other effects, such as local voltage drops, temperature, and/or the like.

The sub-threshold bias generation circuit (STBGC) 103 may increase the effect (i.e. increase the detection) of the sub-threshold leakage current. The STBGC may generate a source-to-gate voltage within the sub-threshold voltage range, which is higher than zero and therefor may amplify the DUTs sub-threshold leakage current.

Alternatively, the skewed inverters reduce the effects on the complementary device. For example, when the DUT is a PMOS, then the number of the ring-oscillator inverter NMOS devices may be positively skewed over the size of the PMOS devices, and vice versa.

Figure 2A:
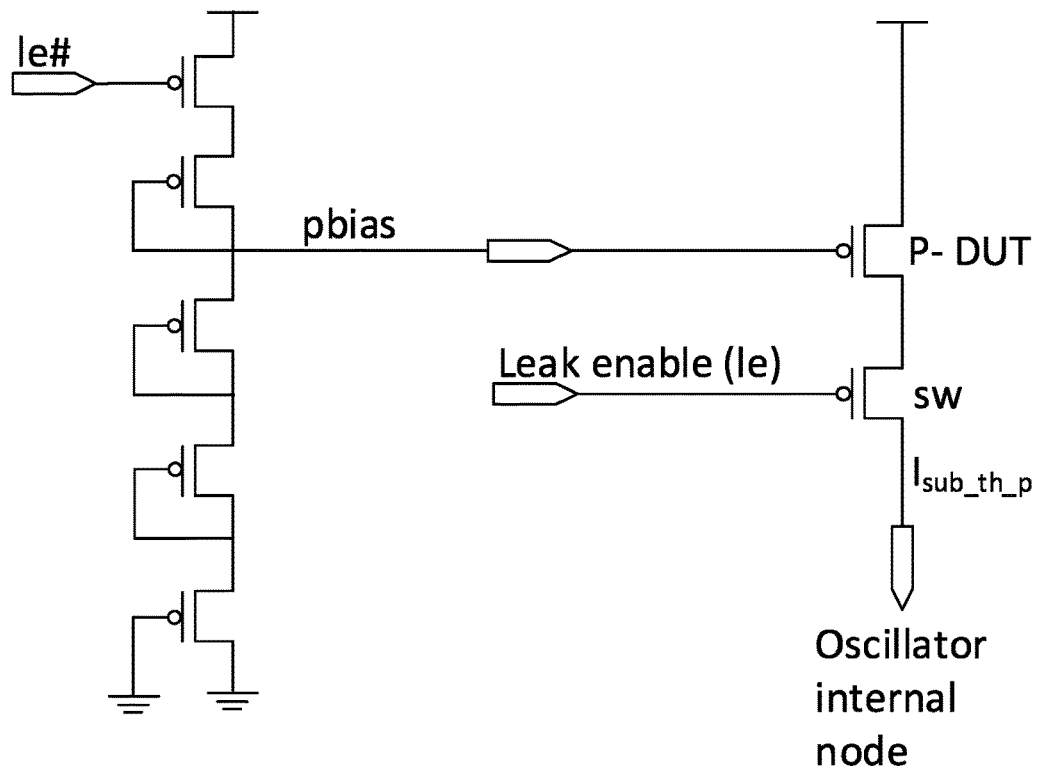
FIG. 2A shows the sub-threshold generation circuit, the P-DUT circuits of the PMOS sensors.
Figure 2B:
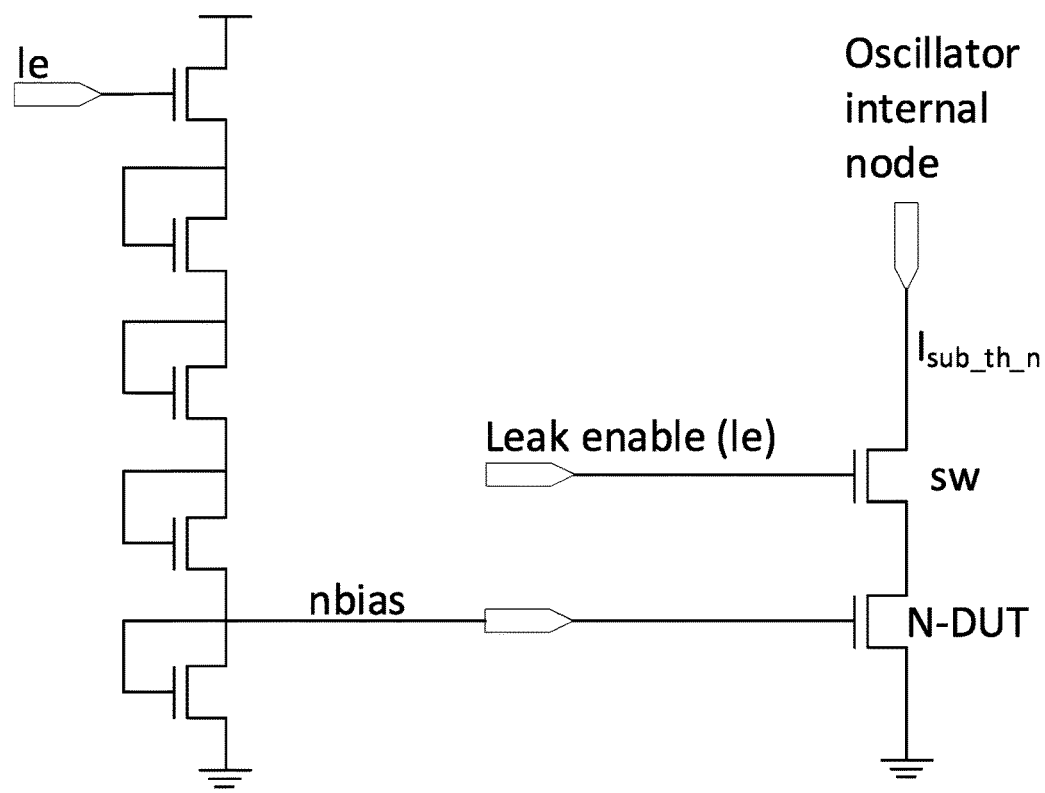
FIG. 2B shows the sub-threshold generation circuit, the N-DUT circuits of the NMOS sensors.

Reference is now made to FIG. 2A and FIG. 2B, which shows the sub-threshold generation circuit, the P-DUT and N-DUT circuits of the PMOS and NMOS sensors. The sub-threshold generation bias circuit generates a sub-threshold gate-to-source voltage by dividing the VDD voltage. The n-bias and p-bias voltages in the following implementation equal to VDD/4, the number of devices should assure gate-to-source voltage at the sub-threshold region or weak inversion.

The electronic conversion of IC leakage current to frequency, and measurement of the frequency to compute the IC leakage current, solves the problem of detecting IC leakage efficiently and with a small number of components. As advanced process technology scales down the threshold voltage, the static (leakage) power becomes a significant portion of the total power (static plus active) consumption of the IC. Existing solutions often use complicated analog circuits combined with analog-to-digital converters to detect the leakage current.

The leakage current is the sub-threshold current in the MOS-transistor between the source and drain when the MOS-transistor is OFF. The sub-threshold current of a MOSFET device when the transistor is at the sub-threshold region, i.e. gate-to-source voltage is below the threshold voltage. The sub-threshold current is significantly affected by the device threshold-voltage and device temperature.

The threshold voltage of the PMOS & NMOS devices is dependent on the manufacturing process. The devices of each IC design manufactured in a particular process (i.e. a particular foundry) may be associated with a certain threshold voltage distribution range. The threshold voltage may vary within the die (i.e. on-die threshold voltage variation effects), which may cause different threshold voltage distributions at different locations on a certain die. The variation of the device threshold voltage can cause variation of the static power consumption between dies and between different locations on the same die.

The multiple leakage sensor values from an individual IC may be considered the leakage profile of that IC, may measure the actual static power of an IC, and may predict the static power based on the leakage profile. This may apply to individual ICs, ICs from the same wafer (i.e. wafer location dependent leakage, etc.), ICs from the same lot, ICs from the same process, foundry, and/or the like. The leakage profile may be used for identification, security, monitoring, tracking, designing, troubleshooting, updating a design, and/or the like.

The leakage sensors may detect leakage from multiple DUTs on an individual IC, such as a die or part of a die, and the IC may use this information collected over time to monitor, track, detect operational anomalies, detect probability of future IC failure, and/or the like. Optionally, the IC may perform corrective or preventative action. For example, an IC uses the measurement of a leakage sensor to determine that the IC is performing within operational characteristics. For example, a mission critical IC uses the measurement of a leakage sensor to determine that the mission critical IC's failure is outside of a mission timeframe.

The data from leakage sensors on one or more ICs may be sent to a central computer to perform analysis of an ICs design and/or production, such as manufacturing site, process, lot, and/or the like. For example, detecting a different leakage profile from a lot may indicate that the lot is defective. For example, detecting a different leakage profile from a wafer may indicate that the wafer is defective. For example, detecting a different leakage profile from a process may indicate that the process is defective. For example, leakage profiles from a large number of ICs are made available to the central computer, and a machine learning analysis is performed to determine if there are classes of ICs that behave abnormally in the field. As an example of this, the machine learning may determine that the design may be improved to lower the standby power of the IC.

The leakage profiles may be individual and specific to an IC, and may be used to identify the IC, such as for security, for tracking, for monitoring, and/or the like. For example, a counterfeit IC from a different process/foundry may not display the same leakage profile as the authentic IC.

The leakage profile of individual and groups of ICs may provide new IC features, improved IC designs, improved efficiency of electronic devices, and/or the like.

Returning to the general terms considered above, the may ROSC forms part of at least one leakage detection circuit, for example such a leakage current is determined for the functional transistor based on the oscillation frequency of the ROSC. Then, the at least one leakage detection circuit may further comprise: a sub-threshold bias generator electrically connected to an input of a device under test (DUT), the DUT comprising the functional transistor and the ROSC being a first storage circuit that is electrically connected to an output of the DUT (such as a drain of the functional transistor); and a frequency measurement circuit.

In embodiments, the semiconductor IC further comprises an electronic switch electrically connected to the output of the DUT, the ROSC being electrically connected to the electronic switch.

In embodiments, the at least one leakage detection circuit is a plurality of leakage detection circuits, each measuring the leakage current from one of a plurality of DUTs.

Leakage Sensor Experimental Results

Following are the results of simulation experiments conducted by the inventors. The sub-threshold voltages may be technology dependent, such as determined by the foundry, process, and/or the like. The techniques and embodiments disclosed herein may be adapted for different process nodes, foundries, IC manufactures, and/or the like, with appropriate modifications to the sub-threshold voltage levels.

Figure 3A:
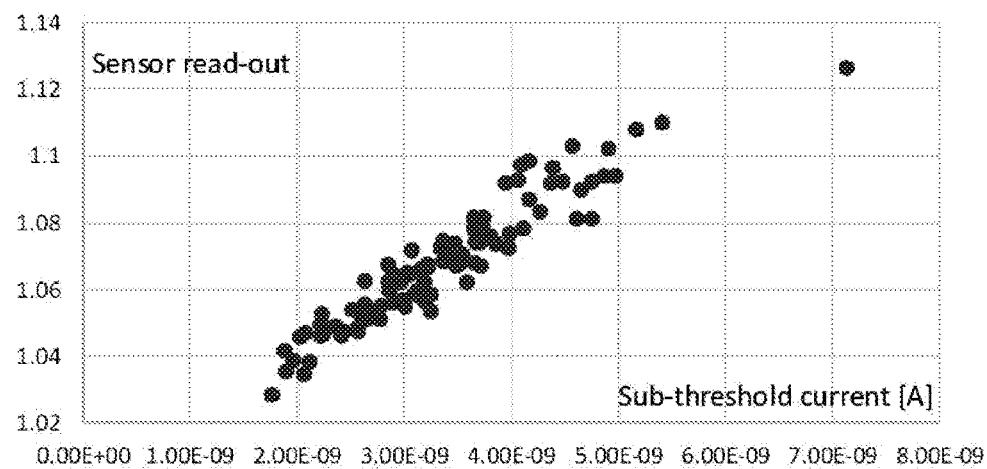
FIG. 3A shows P-DUT simulation results for IC leakage sensing.
Figure 3A:
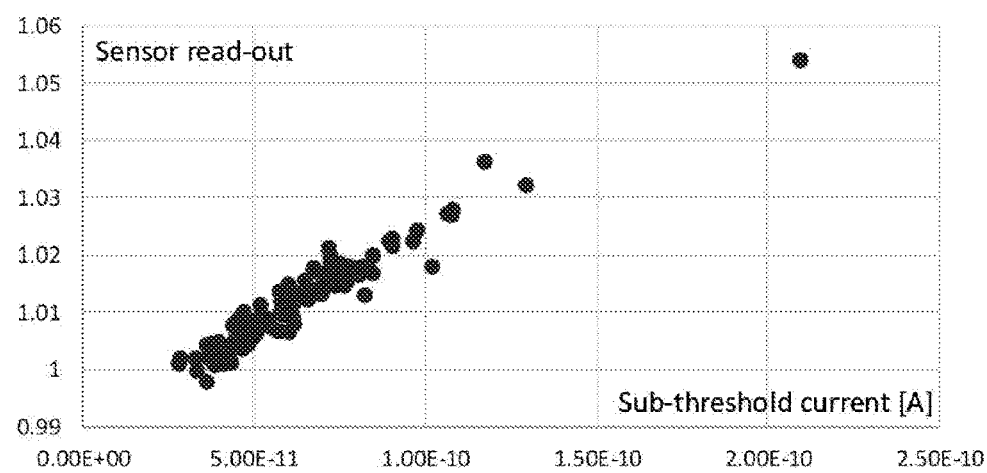
Figure 3A:
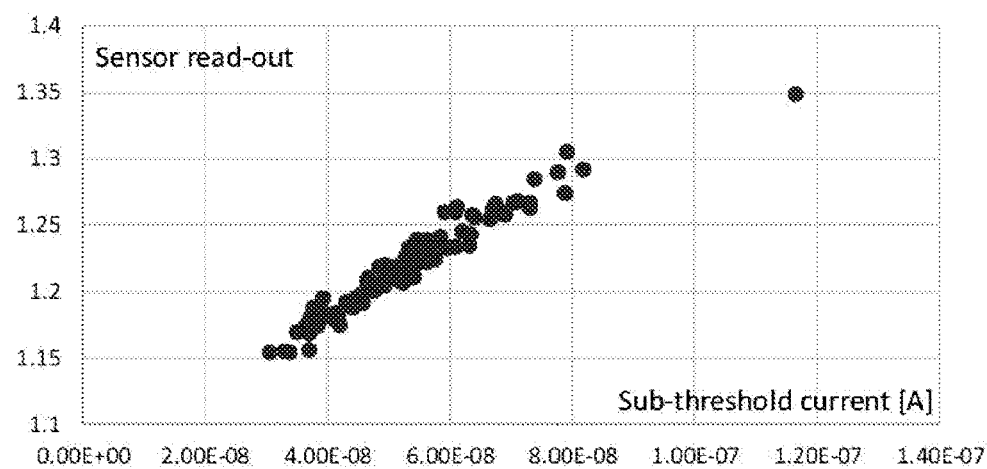
Figure 3B:
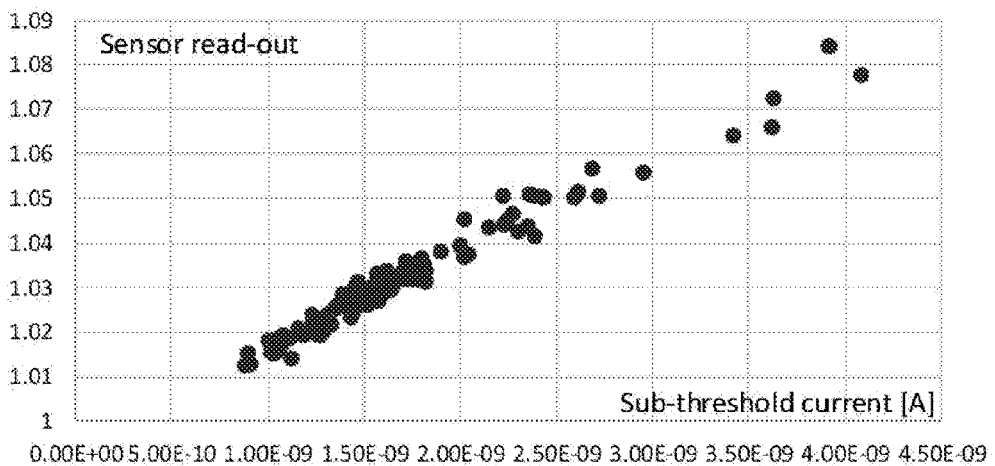
FIG. 3B shows N-DUT simulation results for IC leakage sensing.
Figure 3B:
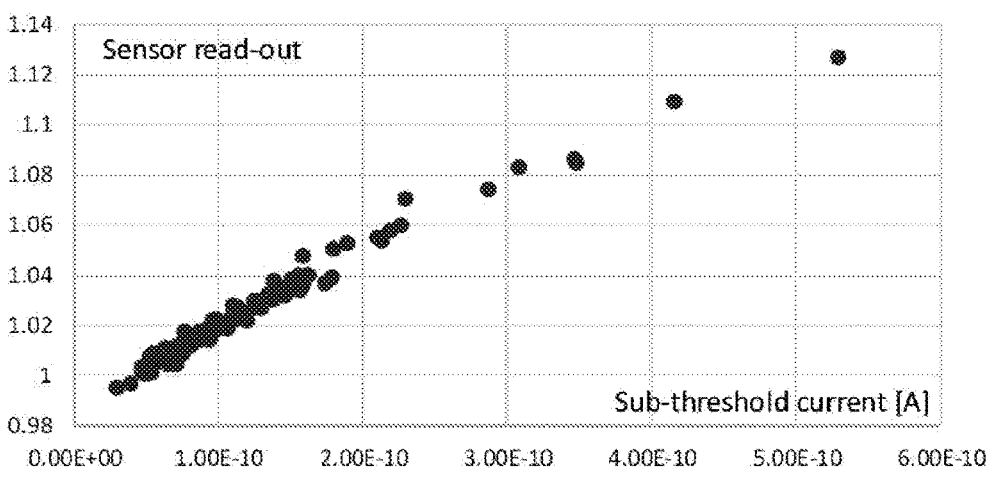
Figure 3B:
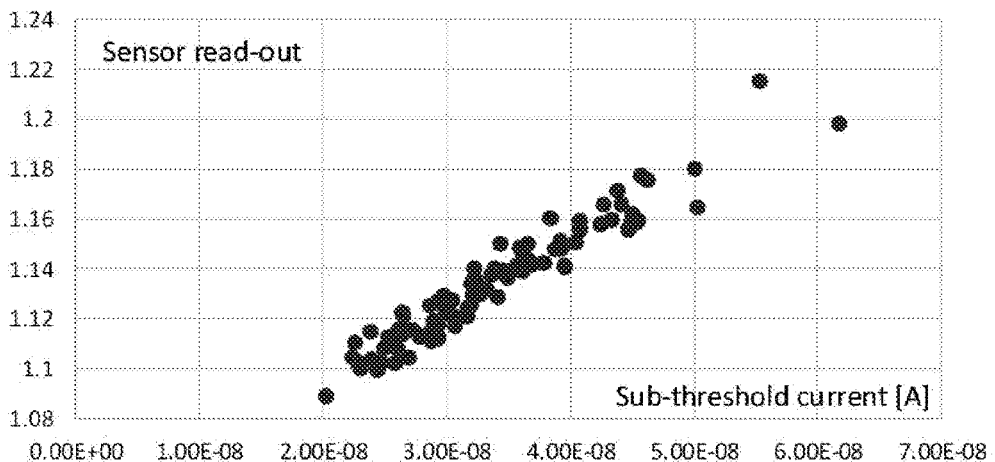

Reference is now made to FIG. 3A and FIG. 3B, which shows P-DUT and N-DUT simulation results for IC leakage sensing. The simulations were done on PMOS and NMOS devices representing 3 different sub-threshold voltages: Low Voltage Threshold (LVT), Standard Voltage Threshold (SVT), and Ultra-Low Voltage Threshold (ULVT). The simulation results use a notation of device type (N or P) and sub-threshold voltages level are combined as a single abbreviation, such as NLVT or the like. Thus, a P-type CMOS DUT simulated at LVT will be denoted PLVT. The simulations were done at the following conditions:

Device temperature of 25 degrees centigrade (a temperature where the sub-threshold current amplitude is significantly low), and Gate-source voltage equal to 0V.

The sensor read-out (i.e. frequency ratio) was compared to the measured sub-threshold current amplitude with wide range of threshold-voltages generated by a Monte-Carlo simulation process. The simulated results show a correlation higher than 0.9 (r) between the sensor read-out and the transistor sub-threshold current amplitude at all device types.

TABLE 1

Simulated result correlations between sensor frequency and leakage current for different devices at different voltages.

| Device type and voltage | Correlation (r) |
|---|---|
| NLVT | 0.98 |
| NSVT | 0.99 |
| NULVT | 0.96 |
| PLVT | 0.95 |
| PSVT | 0.96 |
| PULVT | 0.97 |

Temperature and/or Workload Sensor

For temperature and/or workload sensor, a ROSC is added to the computerized design of a chip (in case simulation is desired) and/or to a physical chip during its fabrication (in case real sensing of temperature and/or workload is desired), in a location where temperature and/or workload measurement is desired. A current is added to feed the ROSC, in a similar manner to that described above with reference to the leakage sensor. The current generator increases the sensitivity of the ROSC to temperature changes, such that even a small change in temperature will result in a large change in oscillation frequency. Moreover, the current generator changes the correlation between ring oscillator frequency and temperature, such that an increase in temperature causes an increase in ring oscillator frequency. The current generator is fed from an output current of a transistor and preferably a leakage current (particularly, current that leaks from the gate of the transistor to its drain, when the gate is driven at a voltage lower that the threshold voltage of the transistor). The ROSC receives this leakage current as an input. This will be discussed further below.

Such a sensor also allows workload and/or stress for the IC (or at least a portion of it) to be detected. Workload or stress is generally considered a function of IC voltage, IC temperature and/or IC activity over time. The voltage of the chip is known (or can be detected), and the temperature may be measured using a ROSC, as noted above. It may also be known or detected as for how long the chip was run under these voltage and temperature conditions. In this way, a stress or workload index can be detected or logged as it changes over time. In practice, an aggregated workload index is provided, which indicates the integral (or aggregate) of the workload over a time interval (for example, the period between the last measurement and the current measurement). The aggregate workload of the present disclosure should be differentiated from momentary workload surrogate measurements known from the literature, which typically include momentary voltage and temperature readings performed at fixed intervals (e.g., every few milliseconds or microseconds). As it is usually impractical to store these readings over a prolonged period (e.g., of more than a few hours), these readings cannot really be indicative of the stress experienced by the IC over relatively long durations of hours or days. The advantageous configuration of the present workload sensor, in contrast, inherently provides aggregate workload of the IC over a previous duration of, typically, at least a few hours up to a few days or even a few weeks.

Figure 4:
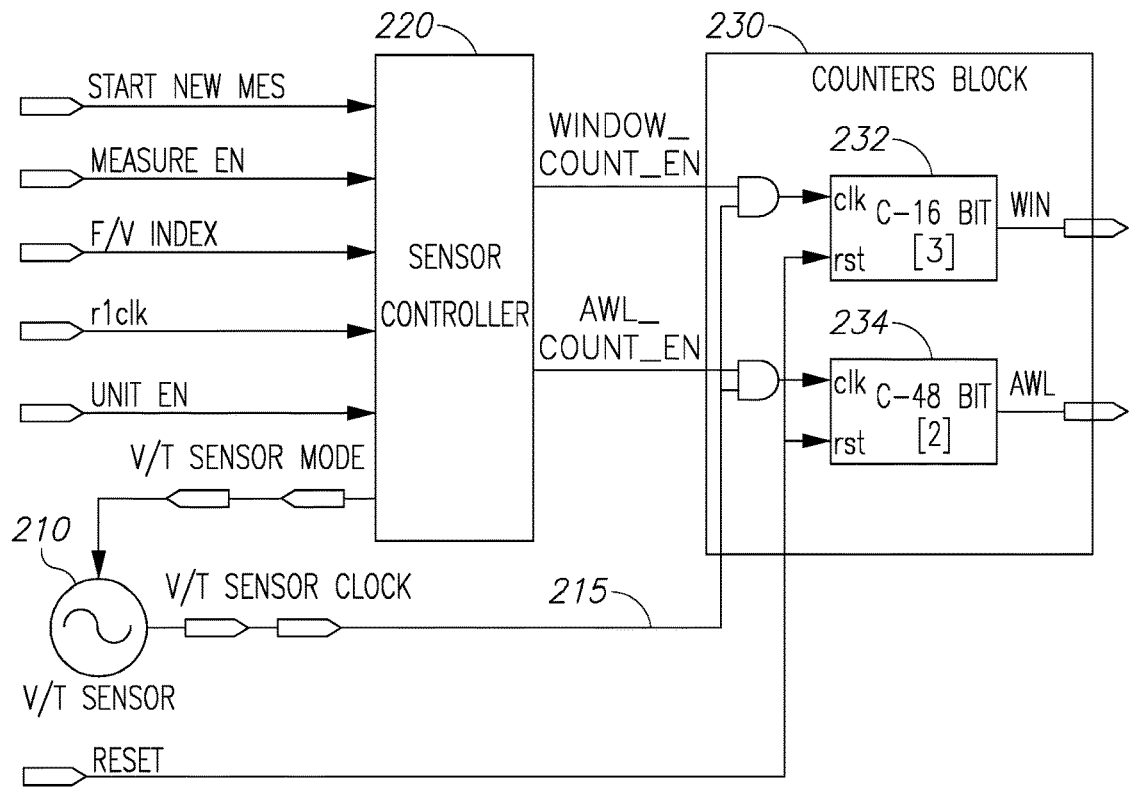
FIG. 4 shows a schematic block diagram of a system for detecting workload for an IC.

Reference is now made to FIG. 4, which shows a schematic block diagram of a system for detecting workload for an IC. This comprises: a Voltage/Temperature (V/T) sensor 210; a sensor controller 220; and a counters block 230. The sensor controller 220 provides a mode signal to the V/T sensor 210, which cause enablement (V/T-mode) or disablement (REF-mode) of providing a leakage current ROSC (for example, ROSC 101, as shown in FIG. 1) within the V/T sensor 210. The ROSC produces an output signal with an oscillation frequency that indicates the detected temperature when the ROSC is provided with the leakage current (V/T-mode) and indicates a base frequency when the ROSC is not provided with the leakage current (REF-mode). This is considered a sensor clock signal 215 in the sensor of FIG. 4 and provided to the counter block 230 as an input.

The counter block 230 comprises: a 16-bit counter 232; and a 48-bit counter 234, both of which are provided with the sensor clock signal 215. The 16-bit counter 232 is configured to provide a WIN value (readout) as an output, which reflects the frequency of the V/T-sensor 210 in REF-mode and the system-clock frequency. During the WIN value generation, the counter 232 is gated by a Window_count_en signal that is generated by the sensor controller 220. The width of the gating signal is equal to N times the system-clock period. N may be a programmable value. A higher system-clock frequency will generate a smaller WIN value and vice versa. The WIN readout can be used as a reference-base-line for the workload measurement. It represents the process corner and the frequency of operation.

The 48-bit counter 234 is configured to provide an Active WorkLoad (AWL) signal as an output. The AWL output reflects the aggregated workload at a certain time-interval. This allows recording or logging of stress or workload over a period of time longer than a single time-interval (and typically, at least 2, 5, 10, 50, 100, 500 or 1000 time-intervals). The time interval value may be calculated using the chip firmware data as the time between start and stop measurement or by counting the system-clock frequency as the number of system-clock cycles between start and stop measurement (not shown in FIG. 4).

In order to normalize the aggregated workload per a certain time-interval and frequency, the AWL value can be divided by the reference-base-line value times the time-interval.

Although the sensor system shown in FIG. 4 provides one type of workload output, the workload index may be manifested in a variety of ways. It could be a percentage value that is common to all chips of the same bin (as discussed below), or more generally of the same model. It could be any other numerical value. The stress log may be saved in a non-volatile memory on the chip itself, and periodically uploaded to the system for storage on its hard-drive, for example. The system may periodically transmit the log to the manufacturer over the Internet.

Figure 5:
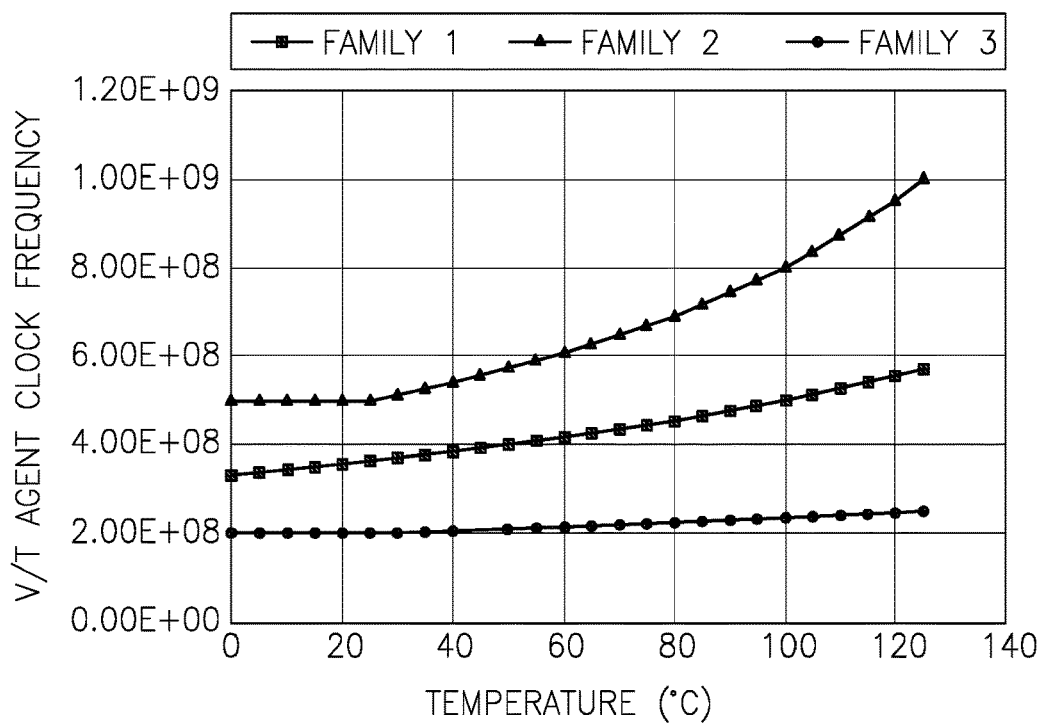
FIG. 5 shows exemplary plots of clock frequency against temperature for a sample sensor for the system of FIG. 4.

Reference is now made to FIG. 5, which shows exemplary plots of clock frequency against temperature for a sample sensor for the system of FIG. 4. The plots of clock frequency against temperature are shown for three different families of IC. The sensor in family 1 has the highest clock frequency and, at least above a certain temperature, the highest rate of increase in clock frequency per unit temperature. The sensor in family 3 has the lowest clock frequency and the lowest rate of increase in clock frequency per unit temperature. The sensor in family 2 sits between the sensors of families 1 and 3 in respect of the clock frequency. However in all cases, increasing temperature causes an increase in clock frequency.

On the basis of such an approach, it may be possible to obtain an accurate temperature (and thus a more accurate measure of workload) using the sensor of the present disclosure. This recognizes that sensors on different ICs may have different relationships between ROSC clock frequency and temperature. For example, this may be because the relationship between the ROSC output frequency and temperature is process dependent (although more predictable and accurate than existing approaches). Moreover, similar IC families typically have the same relationship between the ROSC output frequency and temperature. A family in this context may refer to a group of ICs classified as having a common parameter that is close in value. For example, this may be a group of physical dies with the same Si-profile/classification. In addition, a family may include a group of Monte-Carlo (MC) samples, for which the simulated IC Design Simulation Values and the Device-Process Simulated Values have the same Si-profile/classification as those of the physical family members. More details about IC family classification are described in the U.S. provisional patent application No. 62/675,986 Entitled "INTEGRATED CIRCUIT PROFILING AND ANOMALY DETECTION", filed Apr. 16, 2018, the contents of which are incorporated herein by reference in their entirety.

One way to determine temperature and/or workload based on ROSC frequency is by, before the IC is manufactured, running simulations a computerized version of the IC design to estimate the expected manufacturing inaccuracies. This yields a categorization of the theoretical chips according to their characteristics. This is similar to the well-known technique of "product binning", but performed only in a computer simulation. The simulations also check the reaction of the IC to different temperatures, so that the variation of the ROSC frequency with respect to temperature can be determined, categorized and stored. Examples are shown in Table 2 below (although it should be noted that, in reality, the reaction of the ROSC frequency to temperature need not be linear and may be non-linear, for instance defined by more complex polynomials).

TABLE 2

| | Reaction to temperature |
| --- | --- |
| Chip category 1 | 10 MHz increase of oscillation frequency of the ROSC per each degree Celsius |
| Chip category 2 | 18 MHz increase of oscillation frequency of the ROSC per each degree Celsius |
| Chip category 3 | 30 MHz increase of oscillation frequency of the ROSC per each degree Celsius |

After the simulation results have been completed (although this order is not necessary), the chips are fabricated. Physical tests are run on the chips to associate each individual chip with its category from the earlier simulations. Thus, to measure the temperature (and/or workload) according to this approach using an ROSC of a specific chip: the ROSC frequency of oscillation is measured; and the frequency is compared to the data from the simulation, according to the category of that specific IC.

The data obtained using such sensors can be used in a variety of way. With a large group of similar parts, statistical lifetime workload comparisons can provide insights into their distribution. Additionally or alternatively, during the investigation of the failure of a specific part, workload information may represent the state of part aging or deterioration. In another approach, detection of workload over a pre-set threshold (or some other criterion) may be used for notification purposes, for example as part of preventive or predictive maintenance. Then, a call for replacement of a: specific part (for instance: in the automotive market); or of a group or class (for example, replacing a specific component in all units of a data center). During post-manufacture testing, outputs of the workload sensor may be included in a test-plan, during post-manufacture testing. This may enable better visibility for the calibration of the results. Further applications are discussed below and others may be considered.

Figure 6:
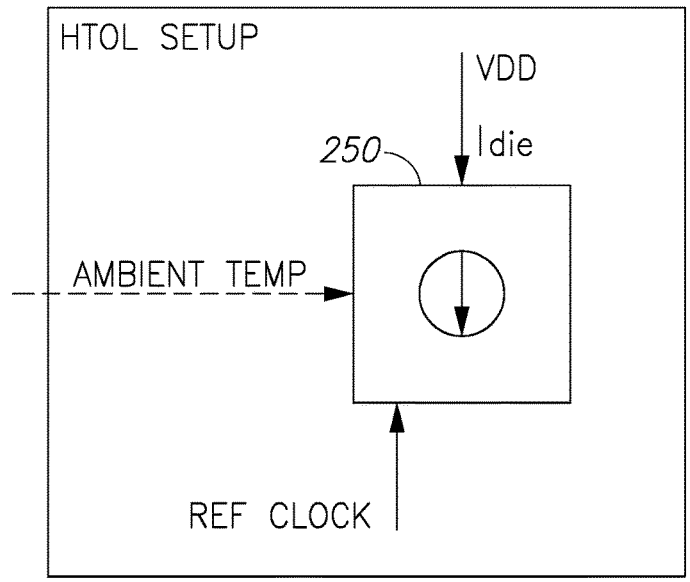
FIG. 6 shows schematically a setup configuration for determining High Temperature Operating Life (HTOL) stress.

Reference is now made to FIG. 6, which shows schematically a setup configuration for determining High Temperature Operating Life (HTOL) stress. The die 250 receives IC supply voltage (VDD), a reference clock and an ambient temperature indication or measurement and draws a die current (Idie). As discussed above with reference to temperature measurement, dies from the same family are expected to show the same behavior when performing at a similar environment such as HTOL (in terms of VDD, Idie, leakage current and temperature) and against HTOL stress. Thus, measurement of workload during the HTOL test and with knowledge of the Family (as discussed above) can provide an indication of HTOL stress against different dies of the same Family. Any exceptional readout can be interpreted as an outlier.

Workload or stress readouts can also be correlated with application-based stress. For example, an application can be associated with a temperature wave over time. Dies from the same family (as discussed above) are expected to show the same behavior when running the same application. A workload corresponding to the Pre-Si Aging temperature can be used as a reference workload and thereby a relative stress per application can be determined.

Figure 7:
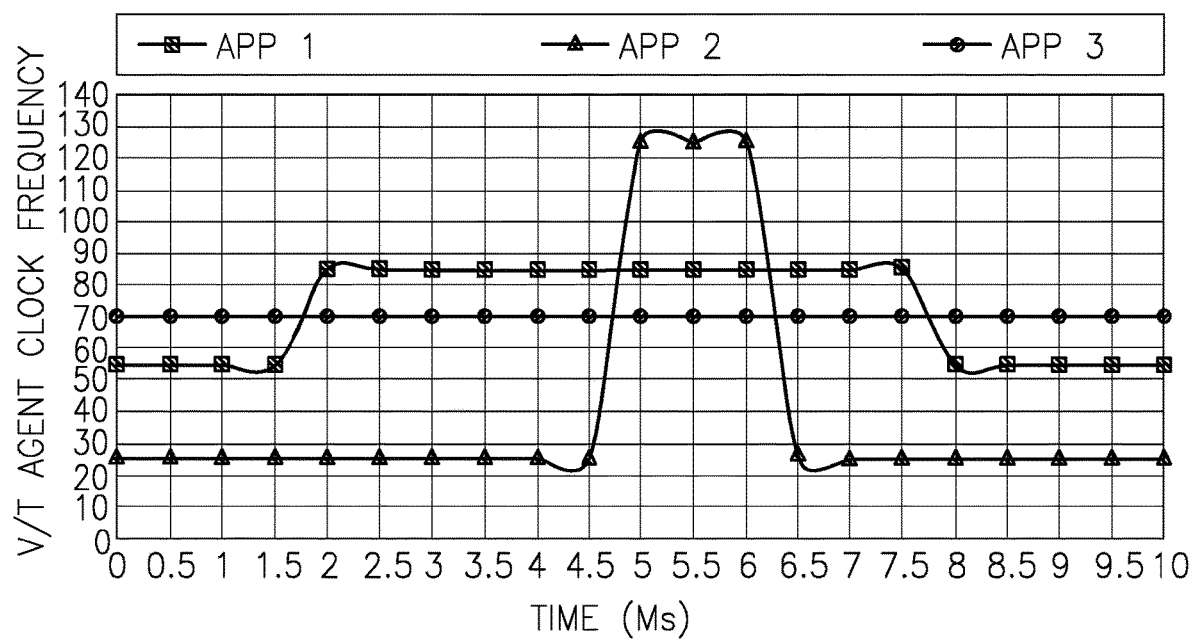
FIG. 7 shows exemplary plots of temperature over time for an IC running different applications.

Reference is now made to FIG. 7, which shows exemplary plots of temperature (in degrees centigrade) over time (in ms) for an IC running different applications. The line at 70° C. represents a reference level. The temperature profiles for two applications are then shown: for the first application (App 1), the temperature is raised from about 55° C. to about 90° C. for around 5 to 7 ms; and for the second application (App 2), the temperature is raised from about 25° C. to about 125° C. for around 1 to 2 ms.

A workload corresponding to the Pre-Si aging that was simulated at a certain (predicted) temperature can be used as a reference workload to be compared with a Post-Si measured workload, to estimate the relative stress per application. The comparison information may be used to determine optional power and/or performance improvement per application.

By generating a repetitive test and reading the workload readout at small time-intervals, a mission-profile based on the readout can be extracted. The extracted mission profile can be used to measure the average stress and determine the reliability margin of the next die (in terms of aging and/or RV). For example, the extracted mission profile can be used to detect a fast temperature gradient that can be correlated with thermal reliability issues, such as the high gradient shown in the temperature increase from about 25° C. to about 125° C. for the second application in FIG. 7.

In such ways, stress logs that have been collected from end users by the manufacturer can be used for enhancing the mission profile of subsequently-manufactured chips. Usually, the manufacturer determines the operational margin of the chips (their "guard-band") by estimating the mission profile of the chips. For example, chips intended for server farms are more likely to work longer hours but experience low ambient temperature due to efficient cooling, while chips used in home computers might work less, but occasionally be exposed to high ambient temperatures. Using existing techniques, manufacturers usually make chips with high margins, to avoid failure even under harsh conditions. By knowledge of the actual stress levels chips actually undergo in the field, manufacturers can perhaps lower the margins accordingly.

Figure 8:
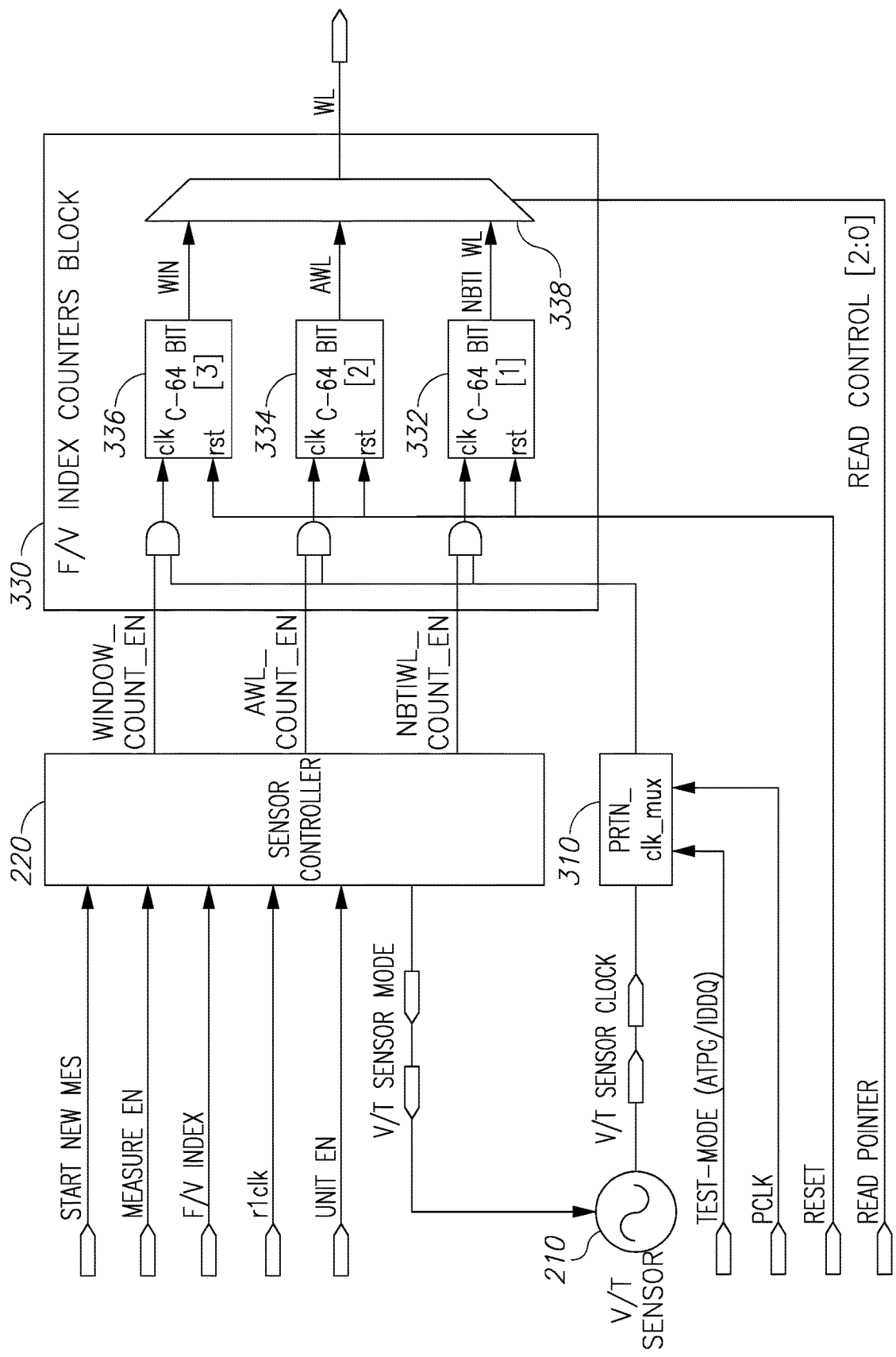
FIG. 8 shows a schematic block diagram of a system for detecting negative-bias temperature instability (NBTI) workload.

The workload measurement may expand to measure directly Negative-bias temperature instability (NBTI) workload, i.e., the stress during a non-active period. Reference is now made to FIG. 8, which shows a schematic block diagram of a system for detecting and measuring NBTI workload. Where the same features are shown as represented in other drawings, these have been indicated using the same reference numerals. The system includes: a Voltage/Temperature (V/T) sensor 210; a sensor controller 220; a clock multiplexer 310; and a counters block 330. The counters block 330 comprises: a first 64-bit counter (counter-1) 332; a second 64-bit counter (counter-2)334; a third 64-bit counter (counter-3) 336; and an output multiplexer 338.

The basic operation is similar to the system shown in FIG. 4, but with some differences. In this system, the first counter (counter-1) 332 is configured to count the ROSC clock from the V/T sensor 210 when the enable signal is low. When the enable is low, the logic gates that associated with the enable are placed in a park-mode and degraded according to a NBTI law. The second counter (counter-2) 334 is configured to measure AWL and the third counter (counter-3) 336 is configured to measure WIN, as discussed above. The output multiplexer 338 is arranged to select the output.

Figure 9:
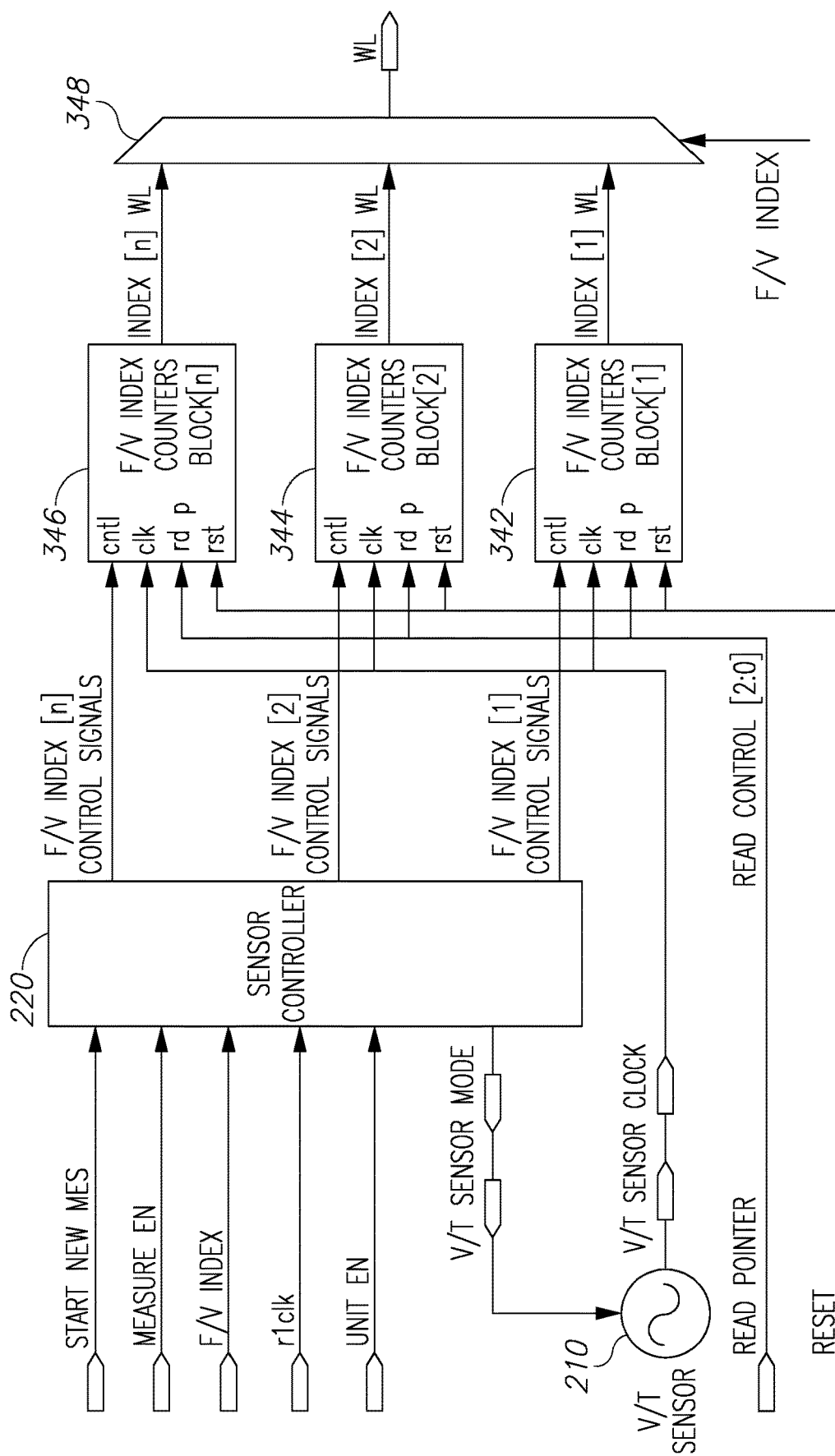
FIG. 9 shows a schematic block diagram of a system for detecting workload per frequency and/or voltage.

The workload measurement may be expanded to measure workload in systems in which the voltage and/or frequency are not fixed, for example when they are constantly changed by the operating system or by the die power-management unit, such as to optimize the system power and/or performance. Reference is now made to FIG. 9, which shows a schematic block diagram of a system for detecting workload per frequency and/or voltage and specifically, workload per frequency/voltage pair (represented by an FN index). Where the same features are shown as represented in other drawings, these have been indicated using the same reference numerals. The system comprises: a first counter block 342; a second counter block 344; a third counter block 346; and an output multiplexer 348. In this system, the counters are multiplied by the number of F/V indexes, and the readout is output per F/V-index using a suitable Read-control signal.

In terms of the generalized sense discussed above, further embodiments may be considered. For instance, the ROSC and the processor may form part of at least one temperature detection circuit. A temperature for the functional transistor is thereby determined based on the oscillation frequency of the ROSC. In that case, stored simulation results may be used for the oscillation frequency of the ROSC at different temperatures to determine the temperature of the functional transistor based on the oscillation frequency of the ROSC. In embodiments, the IC may be identified as having a type selected from a group consisting of a plurality of predefined types of IC. Respective simulation results for the oscillation frequency of the ROSC at different temperatures may be stored for each of the predefined types.

Beneficially, the oscillation frequency of the ROSC increases with increasing temperature. Advantageously, the at least one temperature detection circuit further comprises a current source, an output of the current source providing an input to the ROSC. This may improve temperature sensitivity and measurement accuracy. Preferably, the current source comprises a sub-threshold bias generator coupled to a control terminal of the functional transistor and configured to bias the functional transistor in a sub-threshold state, an output of the functional transistor providing the output of the current source (for instance, as part of a leakage detection circuit as discussed above).

In embodiments, a stress or workload for the IC is determined based on the oscillation frequency of the ROSC. Optionally, the stress or workload for the IC is determined based on a function of one or more of: IC voltage; temperature; and IC activity. In embodiments, the stress or workload is determined at different values of one or both of: a clock frequency for the semiconductor IC (that is, the clock frequency used for the functional components, such as functional transistors); and an operating voltage for semiconductor IC (such as VDD). In particular, the stress or workload may be determined for a pair of clock frequency and operating voltage. The stress or workload is advantageously referenced against the clock frequency and/or operating voltage. In embodiments, the stress or workload for the IC represents an aggregate stress or workload over a time interval. In particular, the time interval may be based on a time duration for measurement of the oscillation frequency of the ROSC. Optionally, the stress or workload is represented by one or more of: a number; a ratio with respect to a reference value for all semiconductor ICs; and a ratio with respect to a reference value for semiconductor ICs of the same type.

A margin loss for the semiconductor IC may be correlated with the stress or workload. Additionally or alternatively, a margin loss for the IC may be determined based on the determined stress or workload and a stored correlation between stress or workload and margin loss.

A Negative-bias temperature instability (NBTI) mode may be selectively enabled or disabled for at least a portion of the semiconductor IC. Then, a stress or workload for the NBTI mode may be determined, when the NBTI mode is enabled.

In embodiments, a notification signal is generated based on a comparison of the determined stress or workload with a predetermined criterion, the notification signal being indicative of one or more of: a state or age of the IC; one or more guard-bands for the IC; and a maintenance or replacement condition.

Advantageously, the determined stress or workload may be compared with a predetermined criterion. Optionally, the predetermined criterion is based on a statistical lifetime workload for semiconductor ICs of the same type as the semiconductor IC. Test results for the semiconductor IC may be calibrated based on the stress or workload.

Optionally, multiple instances of the one or more operating conditions spread over a time period. Then, the determined multiple instances of the one or more operating conditions may be stored, for instance in one or more of: a non-volatile memory in the semiconductor IC; an external storage device on a local system; and an external storage device on a remote system over a network. In embodiments, an aggregate value for the determined multiple instances of the one or more operating conditions over the time period.

A plurality of sets of stress or workload may be determined for the IC, each set of stress or workload being determined from ROSC oscillation frequencies occurring during operation of a respective application by the semiconductor IC. Then, each set of stress or workload may comprise multiple instances of stress or workload, spread over a time period.

In embodiments, the workload or stress response to certain voltage (V) and temperature (T) is modeled and computed as:

$$\text{Stress}_{norm}(V,T) = aV^2 + bT^2 + cVT + dV + eT + f, \quad (1)$$

where a, b, c, d, e, and f are coefficients which are provided, for example, by a designing or a fabricating entity of the chip, based, for instance, on STA analysis and/or on other knowledge pertaining to the fabrication process of the chip.

Fusion of Workload and Margin Readings

Disclosed herein is a method, system, and computer program product for simulating degradation of an IC or estimating degradation of an IC operating in the field, to provide a degradation curve of the IC over time, a predicted time of failure of the IC, and/or to augment margin measurements of an IC operating in the field.

To simplify the succeeding discussion, it mostly refers to simulation of an IC which has not yet been fabricated, based on that IC's design. However, the discussion similarly applies to any degradation-related estimation pertaining to an IC already operating in the field, which includes physical sensors and/or circuits that output real measurements and not just simulated measurements. Those of skill in the art will recognize how to adapt the succeeding discussion to employ the disclosed techniques with respect to an IC already operating in the field. For example, an embodiment of the invention may include an IC having an embedded workload sensor and an embedded margin measurement circuit, as well as program instructions (executed by a processor of the IC or by any other suitable circuit of the IC) that output, during operation of the IC, a degradation estimation and/or an estimated failure time of the IC. The program instruction may further trigger a corrective or preventative action in the IC in view of an approaching failure.

The simulation may also aid in a design process of the IC, such as to improve the design prior to fabrication of ICs according to the design. The simulation may additionally aid in classification and purposing of ICs fabricated according to the design, so that these ICs may be directed to purposes suitable for their estimated degradation and predicted time of failure. Another possible use of the simulation is to determine (and configure, in ICs fabricated according to the design) a suitable power management scheme for the IC, such as parameters (e.g., voltage and frequency) of a DVFS (Dynamic Voltage and Frequency Scaling) system, to meet a certain lifetime target of the IC. Configuring a fabricated IC's DVFS system parameters may take place between when the IC is fabricated and when it is released for field operation (namely, before it is delivered to an end user who will operate it in the field), and/or during the field operation of the IC, at a time determined in advance based on the simulated degradation. For example, these parameters may be configured to initially permit high performance of the IC (with the tradeoff of causing faster degradation), and then re-configured, at one or more times during the field operation of the IC, to lower the IC's performance in order to slow down its degradation. Other configuration schemes are also possible, such as configuring the DVFS system parameters at multiple times (before the IC is released to field operation and/or during field operation) so that the IC's performance remains consistent despite its gradual degradation.

The simulation may be based on results of static timing analysis (STA) of multiple data paths of an IC design, or on any similar timing data of the data paths. These may be data paths determined to be critical paths, for example. STA results may be unnecessary when the degradation estimation is performed for an IC operating in the field. Instead, timing data resulting from readings of the margin measurement circuit may be used.

Then, given the timing data, the degradation of the multiple data paths over the period of time may be simulated by: Simulating an effect of operational conditions, such as temperature, voltage, and/or frequency, on the multiple data paths; simulating an effect of at least one physical degradation phenomenon, such as NBTI, HCI, EM, and/or TDDB, on the multiple data paths; simulating operation of a margin measurement circuit which is embedded in the IC design and configured to monitor the multiple data paths, wherein the margin measurement circuit, in its simulated operation, outputs a time series of values of a worst-case remaining margin of the multiple data paths, namely—the narrowest margin among these paths; simulating operation of a workload sensor embedded in the IC design, wherein the workload estimation circuit, in operation, outputs a time series of values representing operational stress experienced by the IC; and, based on the simulated operation of the workload estimation circuit, increasing a resolution of the simulated operation of the margin measurement circuit, to narrow down the range of worst-case remaining margins, thereby to enhance accuracy of the simulated degradation and respective failure time prediction.

Essentially, since the margin measurement circuit is set up to output the narrowest margin among the data paths it monitors, and since the simulation takes into account the effect of the operational conditions and physical degradation phenomena on the data paths, the output of the margin measurement circuit may be indicative of degradation of these data paths given these effects. This output may be used, for example, to estimate a degradation curve of the data paths over the period of time, and/or to predict a time of failure of the IC due to a timing violation by the worst-performing data path.

However, since the resolution of the margin measurement circuit is relatively coarse, fusing its readings with those of the workload agent may enable finer resolution of the degradation estimation.

Figure 10:
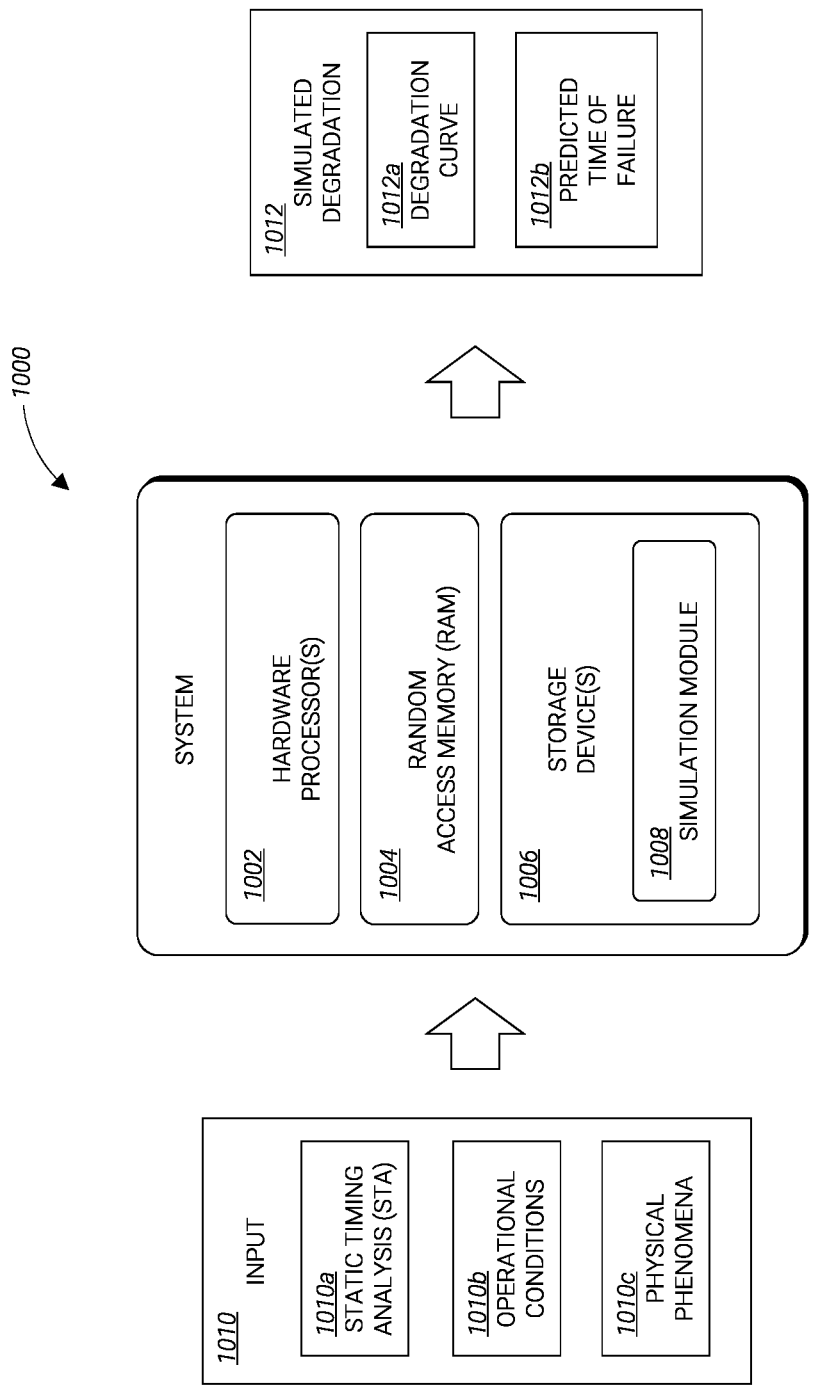
FIG. 10 shows a block diagram of an exemplary system for IC degradation simulation.

Reference is now made to FIG. 10, which shows a block diagram of an exemplary system 1000 for IC degradation simulation, according to an embodiment. System 1000 may include one or more hardware processor(s) 1002, a random-access memory (RAM) 1004, and one or more non-transitory computer-readable storage device(s) 1006.

Storage device(s) 1006 may have stored thereon program instructions and/or components configured to operate hardware processor(s) 1002. The program instructions may include one or more software modules, such as a simulation module 1008. The software components may include an operating system having various software components and/or drivers for controlling and managing general system tasks (e.g., memory management, storage device control, power management, etc.), and facilitating communication between various hardware and software components.

System 1000 may operate by loading instructions of simulation module 1008 into RAM 1004 as they are being executed by processor(s) 1002. The instructions of simulation module 1008 may cause system 1000, in a general sense, to receive input 1010 such as STA results 1010*a*, operational conditions selection 1010*b*, and physical phenomena selection 1010*c*, process the input by way of simulation, and output a simulated degradation 1012 of the pertinent IC, including a degradation curve 1012*a* and/or a predicted time of failure 1012*b*.

System 1000 as described herein is only an exemplary embodiment of the present invention, and in practice may be implemented in hardware only, software only, or a combination of both hardware and software. System 1000 may have more or fewer components and modules than shown, may combine two or more of the components, or may have a different configuration or arrangement of the components. System 1000 may include any additional component enabling it to function as an operable computer system, such as a motherboard, data busses, power supply, a network interface card, a display, an input device (e.g., keyboard, pointing device, touch-sensitive display), etc. (not shown). Moreover, components of system 1000 may be co-located or distributed, or the system may be configured to run as one or more cloud computing "instances," "containers," "virtual machines," or other types of encapsulated software applications, as known in the art.

The instructions of simulation module 1008 are now discussed with reference to an exemplary graphical user interface (GUI) 1200 of a degradation simulator, illustrated in FIG. 11A, and to a flowchart of a method 1300 for simulating degradation of an IC (or more specifically, of critical paths of the IC), illustrated in FIG. 12. GUI 1200 may enable a user of method 1300 to provide input to simulation module 1008 (of FIG. 10) and to observe output of the module. The user may use controls such as a run/resume control 1200*a*, a pause control 1200*b*, and/or a reset control 1200*c* to affect respective actions with regard to the simulation.

Steps of method 1300 may either be performed in the order they are presented or in a different order (or even in parallel), as long as the order allows for a necessary input to a certain step to be obtained from an output of an earlier step. In addition, the steps of method 1300 are performed automatically (e.g., by system 1000 of FIG. 10), unless specifically stated otherwise.

Generally, to produce a simulation spanning a certain period of time (also referred to as a 'time horizon'), method 1300 may be repeated (iterated) for each of smaller periods of time. For example, method 1300 may be repeated for each single day of simulation, to result in an overall simulation spanning a time horizon of hundreds, thousands, or even tens of thousands of days. Similarly, a user of method 1300 may set its iteration period to any desired value, such as one hour, a few hours, a day, a few days, a week, a few weeks, a month, a few months, and so on and so forth. The length of the time horizon may either be decided in advance, or, more typically, the simulation may continue until an indication that the simulated IC has failed due to a timing violation in one (or more) of its data paths, or until the simulation has been lengthy enough to deduce, at a high degree of confidence, when such timing violation is likely to occur.

For a better understanding of the simulation of method 1300, reference is first made, intentionally, to one of the last steps of this method, step 1318, in which operation of a margin measurement circuit is simulated. As briefly mentioned above, the margin measurement circuit is embedded in the IC design (also with the goal of having it fabricated with the IC) to monitor the multiple data paths. Once every predefined period of time (corresponding to one iteration over method 1300), the margin measurement circuit outputs a value of the worst-case remaining margin of the data paths. For example, this may happen once a day, to serve as a measurement of that worst-case remaining margin following the activity of the data paths during that day. The simulation may progress this way on a day-by-day by basis, for example, to output a time series of the worst-case remaining margin values over a longer time horizon, such as hundreds or thousands of days.

Figure 11A:
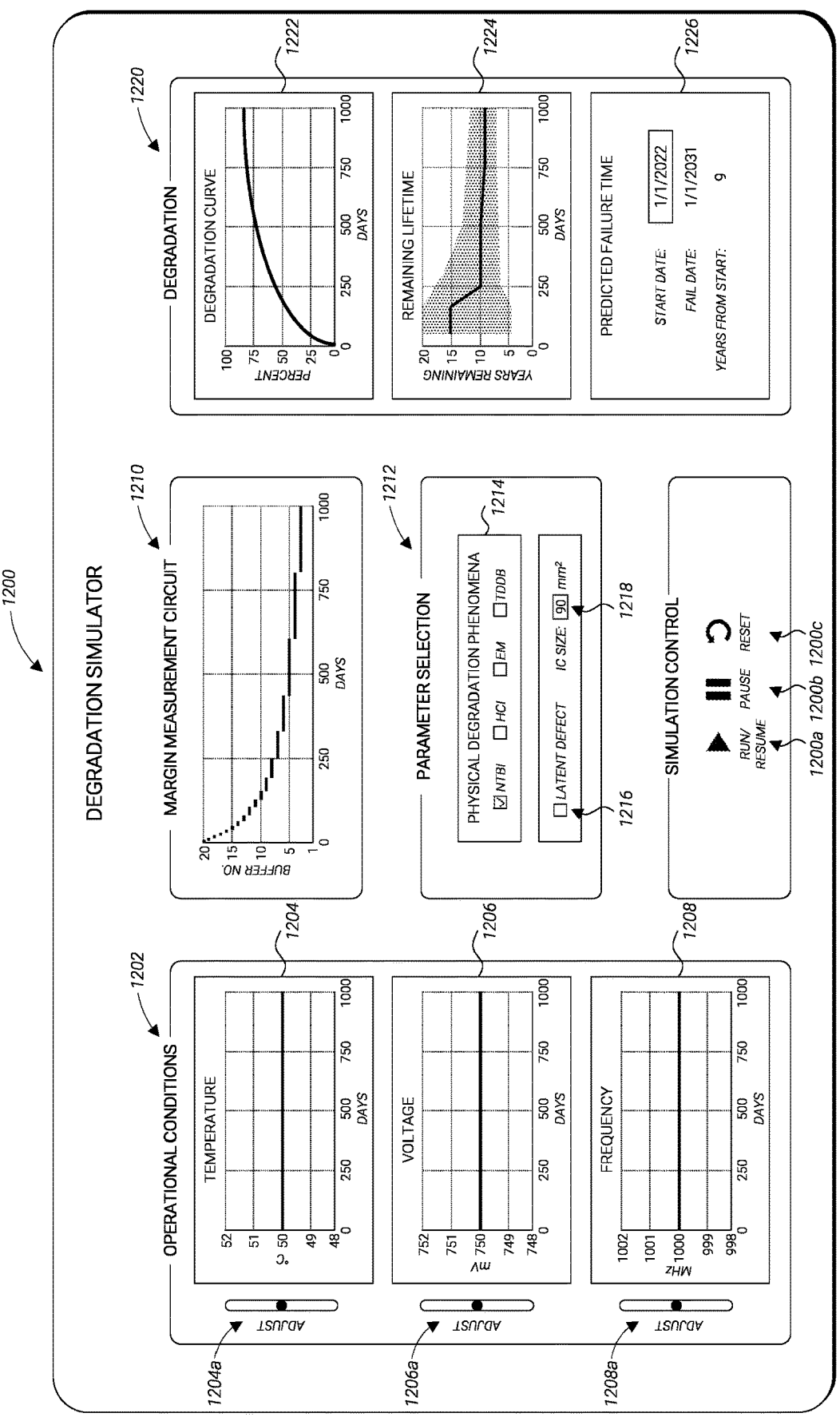
FIG. 11A shows an exemplary graphical user interface (GUI) of a degradation simulator.

With interim reference to FIG. 11A, such exemplary time series is graphically illustrated in a margin measurement circuit panel 1210, showing readings of the margin measurement circuit over an exemplary period of a 1000 days, with a reading (a value) once a day.

The margin measurement circuit which outputs these readings may be identical or similar the timing delay margin measurement circuit or related devices/circuits disclosed in PCT International Publication No. WO2019/097516, entitled "Integrated Circuit Margin Measurement and Failure Prediction Device," which is incorporated herein by reference. Generally, the margin measurement circuit may include the following main components: A signal combiner configured to combine signals from the multiple data paths into a single signal; a signal splitter configured to split the combined signal into two test paths; a delay circuit configured to gradually apply varying levels of delay to signals passing through a first one of the two test paths; a comparation circuit configured to determine the worst-case remaining margin of the multiple data paths, based on a comparison between the first test path and a second one of the two test paths performed at every level of delay.

The term "worst-case" is used here to denote the narrowest (lowest) remaining margin among the multiple data paths. Because signals from the data paths are combined, it may be impossible to know the individual remaining margin of each of these data paths. Instead, the output of the margin measurement circuit may be indicative of the narrowest margin existing among the data paths. This knowledge is typically sufficient, because if even a single critical path fails due to a timing violation, the entire IC may become effectively inoperative.

In some embodiments, for practical reasons, the values output by the margin measurement circuit may be of a relatively low resolution, namely—they may not indicate a precise remaining margin in units of time (e.g., picoseconds), but rather each indicate a range of margins within which the currently-measured remaining margin falls. For example, the margin measurement circuit may be configured to output a serial number of a certain buffer it includes, wherein this buffer encapsulates and indicates a certain range of margin time values. For instance, if the margin measurement circuit includes 20 such buffers, which overall encapsulate 200 picoseconds of margin, then these buffers may encapsulate the following margins measured by the circuit:

TABLE 3

| Margin range encoding by the margin measurement circuit's buffers | |
|---|---|
| Buffer number | Margin range (in picoseconds) |
| 1 | 0.1 (or exactly 0)-10 |
| 2 | 10.1-20 |
| ... | |
| 20 | 190.1-200 |

In the above example, each buffer can be indicative of a margin within a 10-picosecond range. In various embodiments, however, the overall number of buffers, the range per margin, and the resulting overall margin coverage of all buffers may be different. These may be decided upon by the chip designer, who chooses a desired margin for the various data paths in the IC, and configures/designs a margin measurement circuit accordingly. For instance, the overall margin coverage of all buffers (namely, of the margin measurement circuit as a whole) may be in the range of 50-500 picoseconds; this broad range is intended to include any sub-range included therein (e.g., 50-100, 70-300, 400-500, 100-300, etc.) even if such sub-range is not explicitly listed here for reasons of brevity. The number of buffers may be, for instance, between 2 and 100, according to a desired measurement resolution; this broad range is intended to include any sub-range included therein (e.g., 2-20, 5-20, 10-20, 5-30, 10-30, etc.) even if such sub-range is not explicitly listed here for reasons of brevity.

The time series of values which is output when the operation of the margin measurement circuit is simulated may be expressed as buffer serial numbers, shown at the Y axis of margin measurement circuit panel 1210, and day numbers, shown at the X axis of that panel.

However, a problem may arise, for example, when the simulation (or real reading from an IC) outputs the same buffer number for an extended period of time, such as months or years. This is typical in the later stages of life of an IC, but can also sometimes happen in early stages. In such scenario, the extent of degradation during that extended period remains unclear. Accordingly, method 1300 may include an advantageous step 1310 of also simulating operation (or using real readings) of a workload sensor (as discussed above) which outputs, in operation, a time series of values representing stress experienced by the IC during respective time periods. For each time period, the value output by the workload sensor indicates the integral (aggregate) stress along the entire period (typically, at least 12 hours or even at least 24 hours). To utilize the output of the workload sensor for increasing the resolution of the output of the margin measurement circuit, an additional step 1312 may include computing an upper bound and a lower bound of an acceleration factor of degradation (given one or more physical degradation phenomena), and, from these, deriving a finer determination of degradation, which cannot be readily derived just from observing the output of the margin measurement circuit. Accordingly, from the moment the margin measurement circuit changes its output from one buffer number to another, these upper and lower bounds may enable continuing the estimation of degradation even during the time that second buffer number remains as the output of the margin measurement circuit. Accordingly, fusing the readings (output) of the margin measurement circuit and the workload sensor may yield a higher (finer) resolution of degradation estimation compared to using just the margin measurement circuit readings for such estimation. By repeating this fusion process at different times (e.g., once every day, few days/weeks/months), a temporal trend of degradation (e.g., a degradation curve) of the IC may be estimated.

To simulate the operation of the workload sensor in step 1310, operational condition(s) of the multiple data paths may be simulated. The operational conditions may include one or more of temperature, voltage, and frequency. As to temperature, this may be the temperature that would have theoretically been measured by a temperature sensor embedded in the IC, typically (but not necessarily) in the vicinity of the data paths. Integrated circuits tend to heat up during operation, and reach temperatures of, typically, 40-100° C. or beyond. As to voltage, this may be the core voltage of the IC (often termed $V_{coRE}$), which is typically in the range of 0.65-1.3 Volts or beyond. As to frequency, this may be the clock frequency of the IC or of a processor being part of the IC, which is typically in the range of up to a few GHz. Of course, the present invention may also function for operational conditions exceeding these values, such as conditions that will be enabled as semiconductor and microelectronic technologies advance.

With reference to FIG. 11A, an operational conditions panel 1202 may allow viewing, as well as adjusting, a temperature 1204, a voltage 1206, and a frequency 1208. In the simplistic example shown, these three operational conditions have remained constant along the simulated time horizon of 1000 days. However, by adjusting one or more of these operational conditions during the simulation, more complex scenarios may be evaluated, such as of an IC that operates under different operational conditions during different smaller periods of time within the overall simulated time horizon. For instance, a user may pause 1200b the simulation after a certain number of simulated days, and use any of sliders 1204a, 1206a, and/or 1208a to adjust the temperature, voltage, and/or frequency, respectively. Then, the user may resume 1200a the simulation, which will now be effected given the newly-adjusted operational parameter(s). Of course, the pausing 1200b and resuming 1200a of the simulation are only provided for the user's convenience, and the user may choose not to use these functionalities but rather adjust the operational condition(s) on the fly, as the simulation is running; in this case, the new operational conditions(s) will simply apply starting with the next simulated time period (e.g., day), which is the next iteration of method 1300.

Sliders 1204a, 1206a, and 1208b of FIG. 11A are merely shown as a simplistic example of how method 1300 may receive values of the operational condition(s). Such values may of course be received by more sophisticated means, such as by programming method 1300 (optionally, in programming it in advance) to adjust any of these condition(s) at one or more certain iterations over the method.

The upper and lower bounds derived based on the workload sensor, and may be expressed as percentages of change from the last time an absolute margin change was reported by the margin measurement circuit (namely—a change from one buffer to another).

Figures 13, 14:
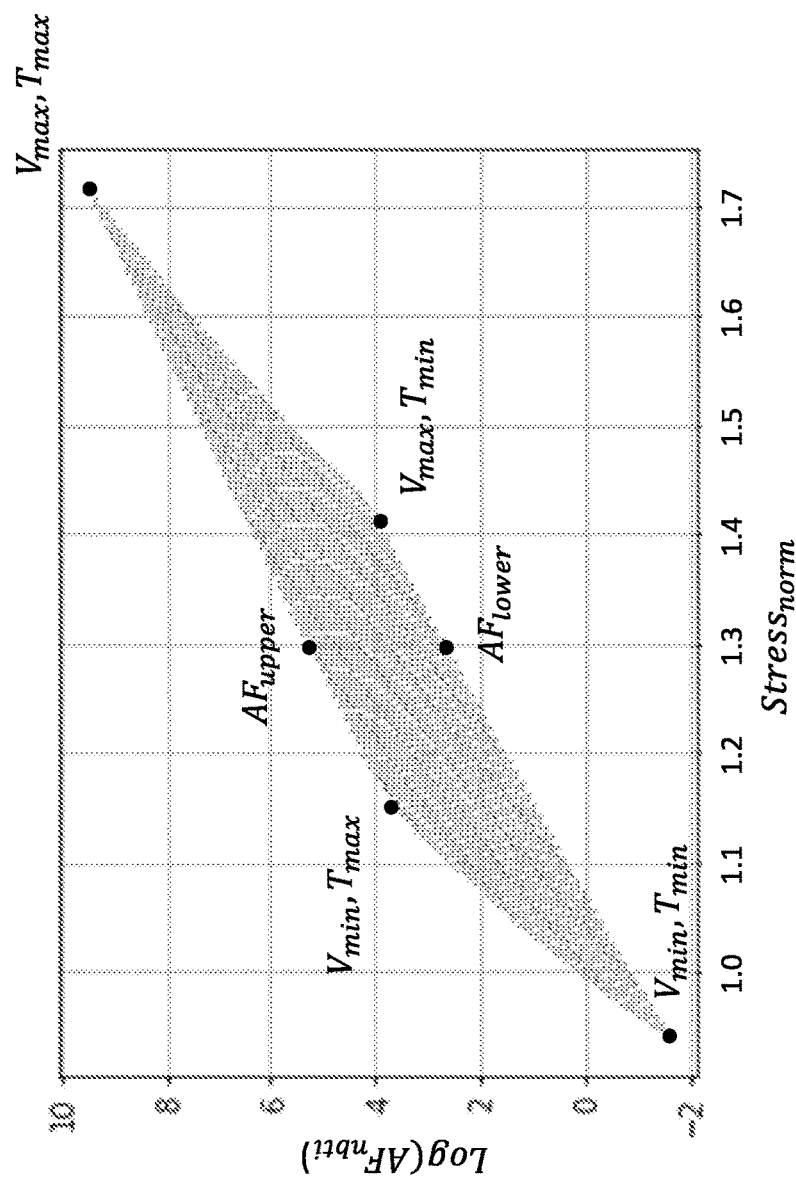
FIG. 13 shows an exemplary rhombus-shaped envelope of stress vs. acceleration factor.
FIG. 14 shows a block diagram of an IC including a margin measurement circuit, a workload sensor, and a processor.

The upper and lower bounds may be computed as follows: First, the stress (or workload) experienced by the IC (such as by the data paths monitored by the workload sensor or by other paths monitored by the workload sensor and assumed to experience a similar workload) may be computed based on the oscillation frequency of the ROSC, as discussed above. This may involve modeling and computing the workload or stress using equation 1, for example. The stress may optionally be normalized respective of a reference stress value. With reference to FIG. 13, for example, the stress may be quantified as a value between 0.9 and 1.8.

Then, the acceleration factor (AF) of a physical degradation phenomenon such as NBTI (but alternatively also HCI, EM, or TDDB), in response to temperature (T) and voltage (V), may be modeled and computed as follows:

$$AF_T(T) = e^{(\alpha \cdot T + \beta)}, \qquad (2)$$

$$AF_V(V) = e^{(\alpha \cdot V + \beta)}, \qquad (3)$$

where e (an exponent) and the coefficients α and β are provided, for example, by a designing or a fabricating entity of the chip, based, for instance, on knowledge pertaining to the fabrication process of the chip and the predicted effects of the particular physical degradation phenomenon (NBTI, HCI, EM, or TDDB) on the chip.

Combining equations 2 and 3 yields the joint acceleration factor NBTI response to voltage and temperature:

$$AF_{nbti}(V,T) = AF_V \cdot AF_T \qquad (4)$$

Then, voltage and temperature corners (namely, maximal and minimal voltage and temperature) of the chip may be obtained (received, determined or estimated), based, for example, on information provided by a designing or fabricating entity of the chip, and/or on simulated or actual corners measured during a certain time period. For example, with reference to FIG. 13, these could be a maximal voltage ($V_{max}$) of 950 my, a minimal voltage ($V_{min}$) of 650 mv, a maximal temperature ($T_{max}$) of 110° C., and a minimal temperature ($T_{min}$) of 40° C.

Since the workload is dependent upon (and directly proportional to) voltage and temperature, plugging the voltage and temperature corners into equations 1 and 4 results in workload corners and acceleration factor corners, respectively. Particularly, the four workload corners provide the X-axis values of the four corners of the rhombus operational envelope of the IC, shown in FIG. 13, and the four acceleration factor corners provide the Y-axis values of these four corners. Namely, equation 1 may be solved four times, for all possible combinations of $V_{max}$, $V_{min}$, $T_{max}$, and $T_{min}$, which yields 4 possible workload values for the respective 4 voltage and temperature corners. Similarly, equation 4 may be solved 4 times for the same combinations of $V_{max}$, $V_{min}$, $T_{max}$, and $T_{min}$, to yield 4 respective AF values. The above process yields the rhombus envelope graphically shown in FIG. 13, by providing the X-axis and Y-axis values for each of the envelope's corners: For example, in FIG. 13, these are $V_{min}$, $T_{min}$=650 mv, 40° C.; $V_{min}$, $T_{max}$=650 mV, 110° C.; $V_{max}$, $T_{max}$=950 mV, 110° C.; and $V_{max}$, $T_{min}$=950 mV, 40° C. Then, the measured workload (1.3 in the example of FIG. 13) is plugged, as the X-axis value, into the equations of the upper and lower sides of the rhombus envelope, to find its two respective Y-axis values—the lower and upper AF bounds. Note that, to obviate this last calculation, acceleration factor values along the upper and lower sides of the rhombus envelope, versus workload values, may be obtained from a stored lookup table.

This results in an upper bound acceleration factor ($AF_{upper}$) of 5.5 and a lower bound acceleration factor ($AF_{lower}$) of 2.5. Namely, for each workload value (e.g., 1.3) there is a range of possible acceleration factor values (e.g., 2.5-5.5) which extend between the upper and lower sides of the rhombus envelope; by plugging the relevant workload value into the equations of the upper and lower sides of the rhombus (or obtaining them from the lookup table), the range of acceleration factors which are possible for that workload value is discovered.

Based on the computed upper and lower bounds, a finer estimation of degradation may be derived as follows. To demonstrate this derivation, reference is made to FIG. 11C, which illustrates an exemplary scenario in which fusion of the readings of the margin measurement circuit and the workload sensor may be very beneficial. According to an exemplary margin measurement circuit panel "1210, the margin measurement circuit has an output of buffer no. 5 (a margin in the range of 40.1 to 50 ps) between days 0-250, and an output of buffer no. 4 (a margin in the range of 30.1 to 40 ps) starting on day 251 and remaining until the simulation ends on day 1000. The only reliable information we have is that on day 250, the margin was likely about 40 ps (the border between the 4th and 5th buffers). Within the later 750-day period, the extent of degradation may be unknown based on just these margin measurement circuit readings. There may be many possibilities, some are exemplified in a degradation curve panel "122. For example, does degradation continue linearly 1254, bringing degradation to 90% on day 1000? Does it continue exponentially in a diminishing fashion 1254, bringing degradation to 90% on day 1000? Or does it continue exponentially but in a decaying fashion 1254, bringing degradation to 80% on day 1000?

The workload sensor readings may bring visibility into this unknown degradation, by providing the upper and lower bounds of the degradation during any of the simulated periods (e.g., each day). This process was described above, in relation to equations 1-4 and FIG. 13. Assume that the acceleration factor bounds computed on day 250, approximately at the buffer no. change (namely, at the border between the two margin ranges defined by the two adjacent buffers), were A and B. This means that degradation on day 250 was also bound between A and B. If the upper and lower bounds of acceleration factor (and hence of degradation) computed on day 500, for instance, are 4% and 2%, lower, respectively, than A and B, it is possible to estimate that the remaining margin at day 500, accordingly, is also between 4% and 2% lower than the remaining margin at day 250. It is also possible to average the upper and lower bounds of acceleration factor (and hence of degradation), e.g., to 3%, and to apply that average to the remaining margin determined at the previous buffer no. change, thereby estimating that the current remaining margin is 3% lower than that at the previous buffer change.

The same manner of calculation and derivation may be performed for every subsequent day or whenever desired, thereby accurately estimating degradation using the workload stress of the IC measured by the workload sensor. Higher workload will result in lower margin values, and vice versa.

As the overall degradation of the IC (or at least of the data paths monitoring by the margin measurement circuit) is directly correlated to the temporal trend of decrease in the remaining margin, it may therefore be said that the IC had degraded by 3% from the time of the previous buffer no. change to the time of the present fusion of the readings of the margin measurement circuit and the workload sensor. By performing multiple such fusions at different times (e.g., different days), it is possible to determine and plot a degradation curve of the IC (respective of the averaged upper and lower bounds of remaining margin discussed above) and/or upper and lower bounds of such gradual degradation (respective of the upper and lower bounds of remaining margin discussed above).

Steps 1308, 1310, and 1312, in which the margin measurement circuit and the workload sensor are simulated and their simulated readings are fused together, can be seen as a culmination of method 1300. That is, each value in the time series output by the simulations of steps 1308-1310 is in fact the result of the multiple factors that have affected the degradation of the monitored data paths in the preceding time period (e.g., a day), namely—the operational conditions, the physical degradation phenomena, the stress endured by the IC, and optionally also the size of the IC, the existence of latent defects, etc. Those of these factors which relate to the margin measurement circuit are discussed below with reference to steps 1306-1308 of method 1300. Those of these factors which relate to the workload sensor were discussed above.

Before the simulation begins, an initial step 1302 of method 1300 (which may not be part of the iteration over the other steps) may be to receive timing data of the multiple data paths of the IC design, such as a margin value (in units of time, such as picoseconds) for each of these data paths. The timing data is optionally the result of a static timing analysis (STA), which is a known simulation method of computing the expected timing of a digital circuit without requiring a simulation of the full circuit. Optionally, but not necessarily, the STA is performed as a step of method 1300. It is also possible to utilize STA results of data paths not of the particular IC design, but which are known to behave similarly, such as from previous versions of that design.

The timing data received in step 1302 may essentially be a list of the initial (i.e., before the IC begins to first operate in the field) margins of the multiple data paths, given in picoseconds or other units of time. For instance, if a certain margin measurement circuit monitors 32 data paths, the STA results may include 32 numerical margin values. It may also be possible, for simplification purposes, to accept as input only a single one of these values, which is the lowest of all values; this simplification technique assumes that the data path with the lowest margin will also be the one whose degradation is always the worst.

It may also be possible, in step 1302, to utilize an arbitrary list of data path margins which is not the result of real STA. This may enable an IC designer to test various hypotheses as to the effect of different margin values of certain data paths on the IC's potential degradation. The designer may simulate, for example, different sets of data path margins (either provided manually or by some randomization algorithm), to determine which of these sets is most preferable and should dictate parameters of the IC design (such as component sizes which affect margin). A further option is for the designer to provide a margin range for each data path, and to have method 1300 automatically repeat as many times as necessary to simulate based on discrete values within each provided range. For example, if a margin range of 200-300 picoseconds is provided for a certain data path, method 1300 may automatically be repeated for discrete margin values such as 200, 210, 220, . . . , 300, or at different increments determined by the designer. Another option is execution of method 1300 based on automatic, random selection of multiple discrete margin values within the provided range(s).

Another option in step 1302 is to receive a list of data path margins which were determined by an IC tester—a device which physically connects to an IC, post fabrication, to test the IC's operation.

Yet another option is step 1302 is to receive a list of data path margins from an IC already operating in the field. These data path margins may be collected from the IC at its initial stage of operation (e.g., in the first few hours, days, or weeks of its operation), so that they reliably indicate these paths' starting point.

Whichever of the aforementioned options is utilized, the margin values received in step 1302 may serve as the starting point (or 'baseline' for a timing margin range) of the simulation performed in subsequent steps of method 1300.

Then, given the STA results, the degradation of the multiple data paths over a time horizon may be simulated by iterating over the following steps a desired number of times, or until the simulation indicates a timing violation that renders the IC inoperable:

In a step 1306, an effect of at least one physical degradation phenomenon on the multiple data paths may be simulated. These physical degradation phenomena may include negative-bias temperature instability (NBTI), hot carrier injection (HCI), electromigration (EM), and time-dependent dielectric breakdown (TDDB), and any other related phenomena known in the microelectronics physics-of-failure (PoF) literature. Each such physical degradation phenomenon has its own typical temporal pattern, usually a certain non-linear degradation curve delineating the rate at which microelectronic, semiconductor components gradually break down. It should be noted that, while some physical degradation phenomena may be expressed in the output of the margin measurement circuit (e.g., NBTI, HCI, and EM), others (e.g., TDDB) may not influence the margin and hence not affect the output of the margin measurement circuit.

With reference to FIG. 11A, inside a parameters selection panel 1212, a physical degradation phenomena panel 1214 may enable a user to select one or more phenomena whose simulation at step 1306 is desired. The user may either let his or her initial selection (e.g., as shown, NTBI) apply to the entirety of the simulation's time horizon, or change this selection during the simulation, such as by pausing 1200b the simulation, adjusting the selection, and resuming 1200a the simulation. The adjustment may also be done without pausing and resuming but rather on the fly, as discussed above.

Optionally, a graph visualizing the effect of the selected physical degradation phenomenon may be displayed to the user (this is not shown in FIG. 11A). This may enable the user to understand the contribution of the selected phenomenon to the overall degradation, separately from the information displayed in degradation panel 1220 (further described below).

Further in parameters selection panel 1212, a user may select to simulate a latent defect 1216 (or a plurality of such defects) existing in the IC. Latent defects are random fabrication defects that typically come to play not immediately, but rather after the IC has been active for a while (e.g., a few weeks, months, or years). When a latent defect begins influencing a certain data path of the IC, it usually causes rapid, exponential degradation. Merely as an example, a weak short circuit may initially have very high resistance, thus not affecting the data path's operation at all. However, that resistance may suddenly begin to drop exponentially, quickly leading to complete failure of that data path's ability to operated. Accordingly, a user may check the latent defect 1216 box at a certain time during the simulation, which will in turn begin to exponentially affect degradation. This may be done with or without pausing and resuming the simulation, similar to what was discussed above.

Further in parameters selection panel 1212, a user may input a size 1218 of the IC (e.g., in square millimeters). This may enhance the simulation of one or more of the physical phenomena. For example, in some relatively recent fabrication processes, TDDB is affected also by the overall size of the IC. This effect, as known in the art, may be factored in the simulation, given the user's input of the IC's size.

Not shown in FIG. 11A but certainly an option, a user may, at any time during the simulation, adjust the instantaneous margin values of the multiple data paths. This may be useful if the user desires to also simulate different software applications executed by the IC (typically, a CPU or a GPU) at different times, exerting different levels of stress on different ones of the multiple data paths. For example, the user may program the simulation module (of FIG. 10) to periodically adjust the margin values of any of the multiple data paths by a certain percentage or absolute amount of time. This may also be performed in the framework of step 1302; instead of simply receiving margin values, that step may include receipt of margin values (or adjustments thereof) and instructions on when to apply them during the time horizon. The programming may be commensurate with what the user predicts to be the usage profile of the IC, which may execute different software applications at different times during its lifetime. For instance, if the IC is a CPU installed in a motor vehicle, the user may simulate the effect of a later firmware upgrade, which causes higher CPU utilization (and more activity in any of the multiple data paths) and might accelerate the degradation of the CPU. The user may do so by introducing a certain margin reduction at the day the firmware is expected to be upgraded.

Figure 12:
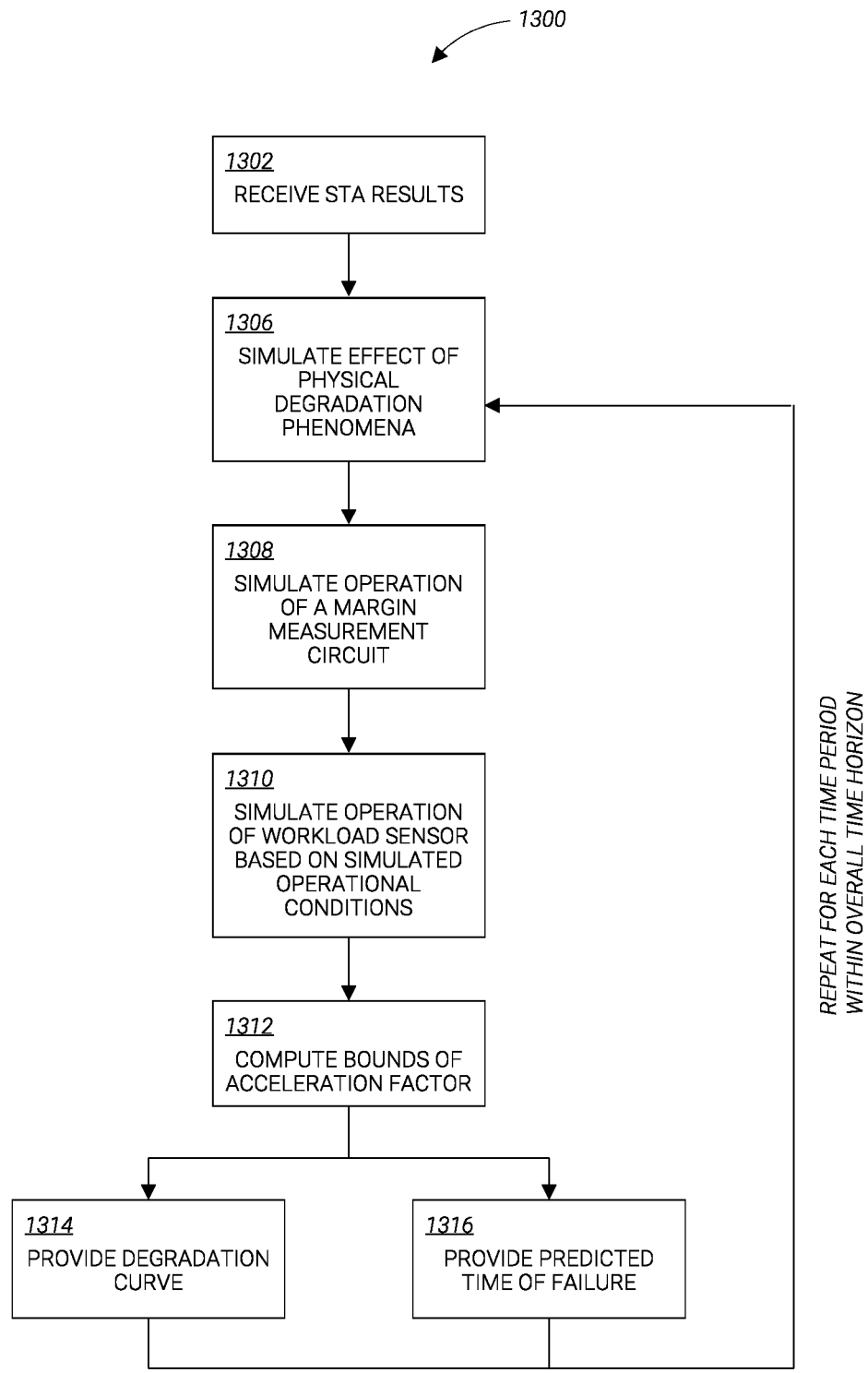
FIG. 12 shows a flowchart of a method for simulating degradation of an IC.

Back to FIG. 12, in the simulation of steps 1306 and/or 1308, the effect of the operational conditions and/or the physical degradation phenomena may be calculated, inter alia, based on existing knowledge in the field of reliability in electrical engineering, as expressed, for example, in J. W. McPherson, "Reliability Physics and Engineering," Springer (2010), which is incorporated herein by reference.

At steps 1314 and 1316, the simulation 1308 of the margin measurement circuit and the simulation 1310 of the workload sensor may be utilized to provide a degradation curve of the IC over time, and a predicted time of failure of the IC, respectively, as discussed below with reference to step 1312. That step essentially fuses the simulations of the margin measurement circuit and of the workload sensor.

Referring now to a degradation panel 1220 of FIG. 11A, a degradation curve 1222 may be plotted respective of a fusion of the time series output by the margin measurement circuit and shown at margin measurement circuit panel 1210, with the upper and lower bounds output by the workload sensor. The exemplary degradation curve 1220 shown here is non-linear, exhibiting a gradually decreasing rate of degradation. An approximately 80% degradation is reached at day 1000, and by the slope of the curve it may be deduced, even by eyeballing only, that 100% degradation (i.e., timing violation) may only be reached years later. The degradation curve may be plotted in real time during the simulation, namely, the curve may be extended over the X axis at each iteration of method 1300. Of course, it is also possible to plot the entire degradation curve 1222 at once, as the end of the time horizon is reached.

Reference is made to a remaining lifetime panel 1224 of GUI 1200, which presents one option of visualizing the predicted failure time (or, essentially, the predicted remaining lifetime) of the IC. The black curve denotes the IC's remaining lifetime in units of years (the Y axis), and the X axis of this curve shows the evolution of that lifetime prediction during the simulation's time horizon. For example, as shown, a remaining lifetime prediction (of 15 years) was first available after approximately 30 days, when enough data has been accumulated. Then, as the simulation progressed, the remaining lifetime prediction reduced to 10 years (between 250 and 500 days of simulation), then to 9 years (at 750 days), and remained at 9 years until the simulation ended at 1000 days. The gray (halftoned) 'envelope' shown behind the black curve denotes the confidence level of that remaining lifetime prediction at each time during the simulation. Initially, at approximately day 30, the confidence level is still relatively low, given the low amount of accumulated data, and therefore the envelope shows a relatively wide prediction of anywhere between 5 and 20 years. As time progresses, confidence grows and the envelope becomes narrower, eventually indicating a range of 7.5 to 12.5 years at day 1000.

Reference is now made to additional options of presenting the predicted failure time, shown here in a predicted failure time panel 1226 of GUI 1200. Here, the predicted failure time may be presented in term of years of operation until failure (e.g., 9 years, as shown), or, if the user provides a start date of the operation of the IC (e.g., Jan. 1$^{st}$, 2022, as shown), the predicted failure time may be provided as a date (e.g., Jan. 1$^{st}$, 2031, as shown). The predicted failure time panel 1226 may either show the predicted failure time as the end of the time horizon is reached, or begin showing and updating it earlier, respective of degradation trend apparent from the simulation up to each point in time. For example, it may be possible to extrapolate, already at day 500 of the simulation, that the exponential shape of the degradation curve 1222 so far will lead to failure in about 10 years, assuming the same operational conditions and physical degradation phenomenon remain the same.

Figure 11B:
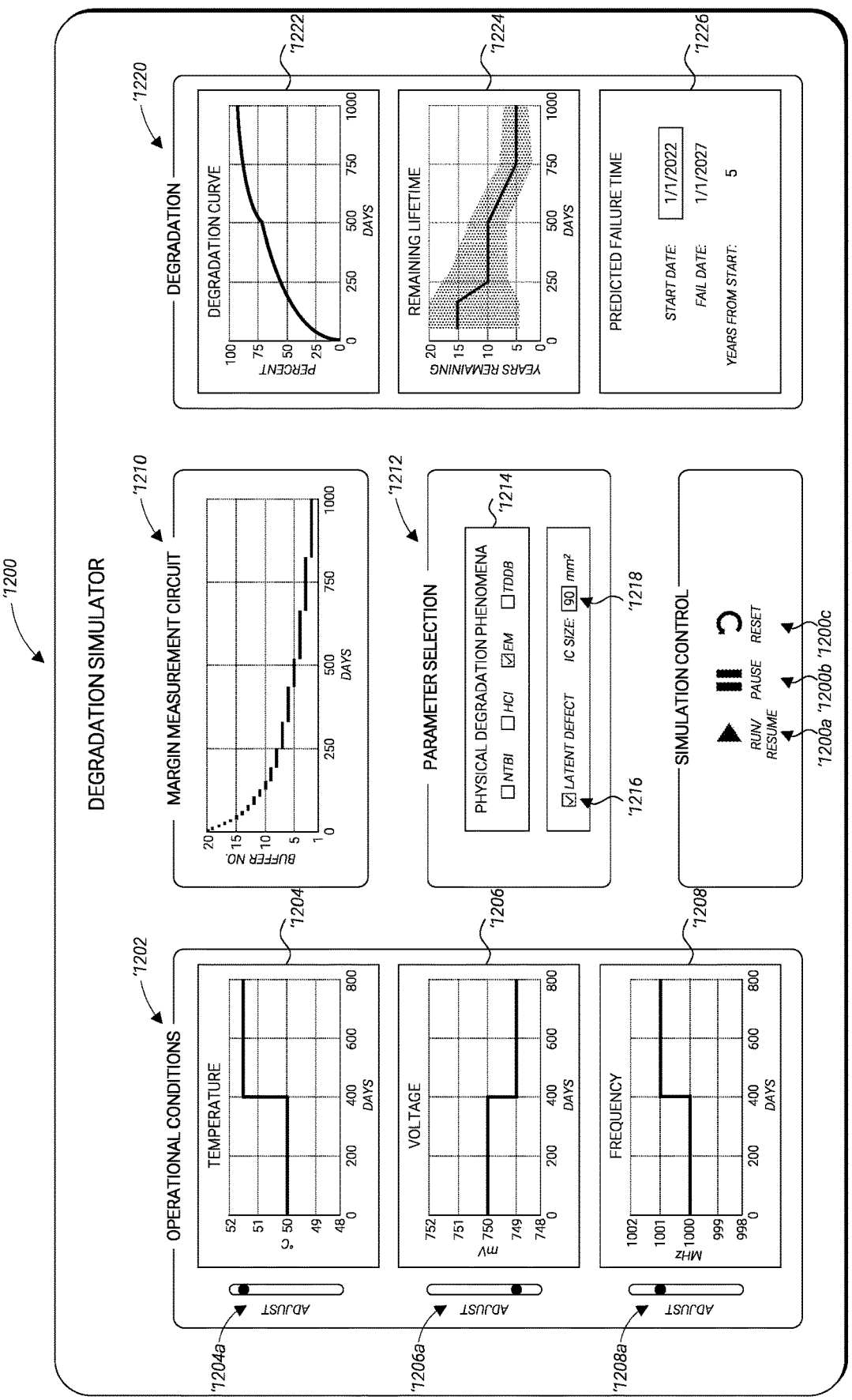
FIG. 11B shows another exemplary GUI of a degradation simulator.
Figure 11C:
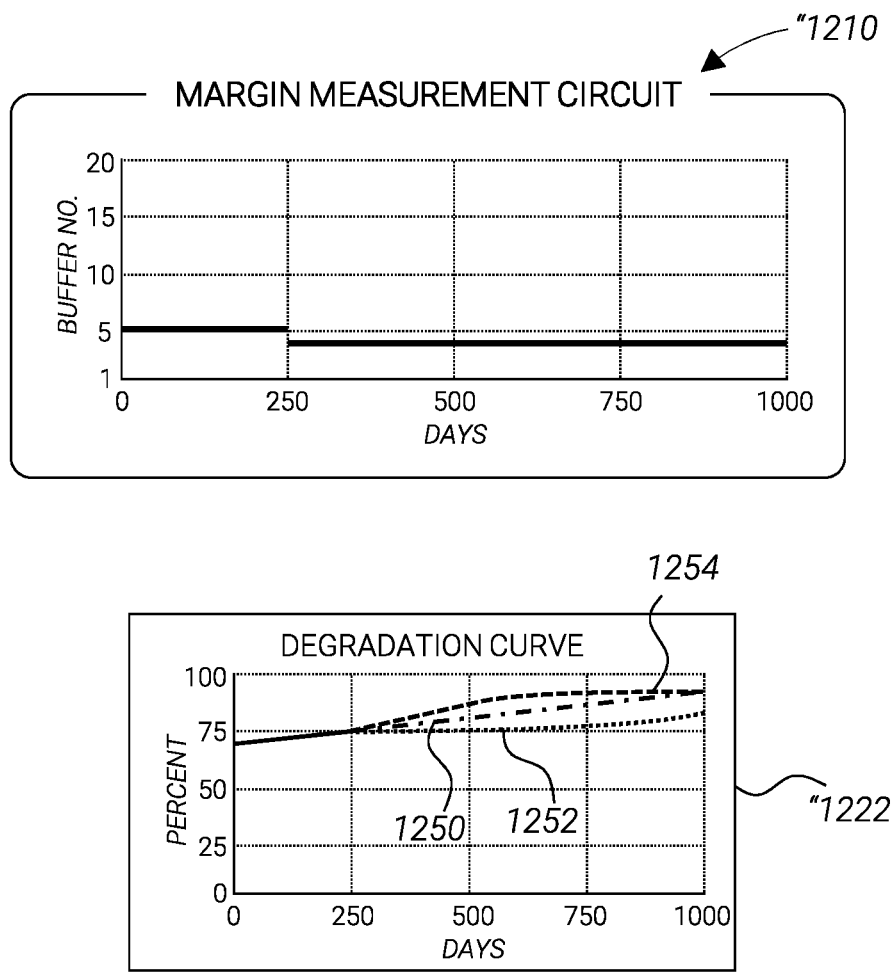
FIG. 11C graphically illustrates an exemplary scenario in which fusion of readings of a margin measurement circuit and of a workload sensor may be beneficial.

Reference in now made to FIG. 11B, which is identical to FIG. 11A except for the aspects discussed below. Reference numbers of the same elements in these two figures are marked with an apostrophe in FIG. 11B; for example, degradation simulator 1200 of FIG. 11A is marked with '1200 in FIG. 11B.

FIG. 11B demonstrates a situation in which, at day 500 of the simulation, the user made certain adjustments to the operational conditions '1202, the physical degradation phenomena '1222, and the latent defect '1216 checkbox: The temperature '1204 was increased from 50° C. to 51.5° C., the voltage '1206 was decreased from 750 mV to 749 mV, the frequency was increased from 1000 MHz to 1001 MHz, the physical degradation phenomenon '1222 was changed from NTBI to EM, and a latent defect '1216 has been selected. These changes caused degradation to accelerate, leading to failure of the IC on year 5 instead of year 9. The acceleration, beginning on day 500, is noticeable, for example, in the time series at the margin measurement circuit panel '1210, in the degradation curve panel '1222, in the remaining lifetime panel '1224, and in the predicted failure time panel '1226.

Similarly to the adjustments made by the user and shown in FIG. 11B, the user may manually or programmatically (e.g., by pre-programming what changes need occur during the simulation, and when) make any one or more adjustments to any of the operational conditions, physical degradation phenomena, and/or latent defect selection.

The simulation of method 1300 may also become useful after ICs have been fabricated according to the IC design and put to use in the field. Data may be collected from operating margin measurement agents and workload sensors embedded in these ICs, in the form of numerical margin readings (or, as discussed above, buffer numbers that are indicative of margin ranges) and numerical workload values (indices). The data may either show that a particular operating IC degrades according to the simulation (of method 1300), or deviates from the simulation given the way it is being utilized by different software applications, environmental conditions, operational conditions, latent defects, etc. If the IC shows deviation from a threshold that has been determined (and stored in the IC) based on the simulation, an alert may be issued regarding any faster or slower degradation, and/or as to an updated lifetime prediction of that particular IC. The alert may be issued to a user of the IC (e.g., owner of a computing device in which the IC is installed, owner of a motor vehicle in which the IC is installed), and/or to any entity in the supply or maintenance chain of the IC, such as the IC designer or manufacturer, a system (e.g., computing device or motor vehicle) manufacturer or service provider, etc.

Reference is now made to FIG. 14, which is a block diagram of an IC 1500 including a margin measurement circuit 1502, a workload sensor 1504, and a processor 1506. This configuration may be useful for accurately estimating degradation of IC 1500 during its field operation, by fusing together, using processor 1506, readings of margin measurement circuit 1502 and workload sensor 1504. Such fusing may be performed as discussed above with respect to the simulation of those circuit and sensor, with the necessary changes that will become apparent to those of skill in the art. Briefly, margin measurement circuit 1502 may output, every certain period of time, a buffer number or any other type of relatively low-resolution indication of a range of remaining margin of the data paths it monitors. Workload sensor 1504 may output, for that same period of time, aggregate workload values of stress experienced by the IC (or at least the data paths which the workload sensor senses, or of other data paths of the IC, which are deemed to experience a similar workload as the data paths monitored by the margin measurement circuit).

Processor 1506 may receive these outputs and fuse them together, by first computing the upper and lower bounds of the acceleration factor, and then using these bounds to determine by how much the previously determined margin (the margin at the border of the two buffers upon changing from one buffer to another) has changed at current time, given the aggregate workload which was last output by workload sensor 1504. This yields a finer range of a possible margin than the broader range defined by the current buffer. Based on this finer range (or on the middle point of its two extremities), an estimated degradation of the IC (or specifically of the monitored data paths) may be readily computed.

Processor 1506 optionally performs initial fusion every time the margin measurement circuit changes its output from one range (buffer) to another, which is a point in time when the margin is known relatively accurately and not just as a broad range. This accurate margin may be used as a baseline for subsequent adjustments given the upper and lower bounds of the acceleration factor (and hence degradation) indicated by the workload sensor at subsequent time periods. For example, if that accurate margin is 40 ps and the subsequent an upper bound and lower bound point at a 2% and 4% change, respectively (having a middle point of 3%), the worst-case remaining margin of the monitored data paths may be determined to be 3% lower than 40 ps, namely −38.8 ps. It is also possible to express the higher-resolution degradation by a range which is narrower than the range expressed by the buffer no. provided by the margin measurement circuit. For instance, given the upper and lower bounds of 4% and 2%, respectively, the narrower range of worst-case remaining margin may be computed to be 39.2-38.4 ps.

General Points

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The skilled person will appreciate that combinations and sub-combinations of specific features disclosed herein may also be provided, even if not explicitly described.

What is claimed is:

1. A non-transitory computer readable medium having stored thereon a computer-readable encoding of a semiconductor integrated circuit (IC), the computer-readable encoding of the IC comprising encodings of:
   a functional transistor, having an output configured to provide an electrical current;
   a ring oscillator (ROSC) circuit, located proximate to the functional transistor and having an oscillation frequency in operation, wherein the ROSC has an input coupled to receive the electrical current from the output of the functional transistor; and
   a processor, configured to determine one or more operating conditions of the functional transistor based on the oscillation frequency of the ROSC.

2. The non-transitory computer readable medium of claim 1, wherein the processor is configured to use stored simulation results for the oscillation frequency of the ROSC at different operating conditions to determine the one or more operating conditions of the functional transistor.

3. The non-transitory computer readable medium of claim 1, wherein the ROSC forms part of at least one leakage detection circuit, such that the processor is configured to determine a leakage current for the functional transistor based on the oscillation frequency of the ROSC.

4. The non-transitory computer readable medium of claim 3, wherein the at least one leakage detection circuit further comprises:
   a sub-threshold bias generator electrically connected to an input of a device under test (DUT), the DUT comprising the functional transistor, and the ROSC being a first storage circuit that is electrically connected to an output of the DUT; and
   a frequency measurement circuit.

5. The non-transitory computer readable medium of claim 4, further comprising:
   an electronic switch electrically connected to the output of the DUT, the ROSC being electrically connected to the electronic switch.

6. The non-transitory computer readable medium of claim 4, wherein the output of the DUT is a drain of the functional transistor.

7. The non-transitory computer readable medium of claim 4, wherein said at least one leakage detection circuit is a plurality of leakage detection circuits, each configured to measure the leakage current from one of a plurality of DUTs.

8. The non-transitory computer readable medium of claim 1, wherein the ROSC and the processor form part of at least one temperature detection circuit, and the processor is further configured to determine a temperature of the functional transistor based on the oscillation frequency of the ROSC.

9. The non-transitory computer readable medium of claim 8, wherein the processor is further configured to use stored simulation results for the oscillation frequency of the ROSC at different temperatures to determine the temperature of the functional transistor based on the oscillation frequency of the ROSC.

10. The non-transitory computer readable medium of claim 8, wherein the processor is further configured to identify the IC as having a type selected from a plurality of predefined types of ICs, the processor being further configured to use stored respective simulation results for the oscillation frequency of the ROSC at different temperatures for each of the predefined types.

11. The non-transitory computer readable medium of claim 8, wherein the at least one temperature detection circuit further comprises a current source, an output of the current source providing an input to the ROSC.

12. The non-transitory computer readable medium of claim 11, wherein the current source comprises a sub-threshold bias generator coupled to a control terminal of the functional transistor and configured to bias the functional transistor in a sub-threshold state, the output of the functional transistor providing the output of the current source.

13. The non-transitory computer readable medium of claim 12, wherein the sub-threshold bias generator forms part of at least one leakage detection circuit that comprises:
   a sub-threshold bias generator electrically connected to an input of a device under test (DUT), the DUT comprising the functional transistor, and the ROSC being a first storage circuit that is electrically connected to an output of the DUT; and
   a frequency measurement circuit.

14. The non-transitory computer readable medium of claim 1, wherein the processor is configured to determine a workload for the IC based on the oscillation frequency of the ROSC and further based on a function of one or more of: IC voltage, IC temperature, or IC activity.

15. The non-transitory computer readable medium of claim 14, wherein the processor is further configured to:
   determine the workload at different values of one or both of: a clock frequency for the semiconductor IC, and an operating voltage for semiconductor IC; and
   provide the workload referenced against the clock frequency and/or the operating voltage.

16. The non-transitory computer readable medium of claim 15, wherein the workload for the IC represents an aggregate workload over a time interval of multiple hours before the processor uses the oscillation frequency of the ROSC to determine the workload.

17. The non-transitory computer readable medium of claim 15, wherein the workload is represented by one or more of: a number, or a ratio with respect to a reference value for semiconductor ICs of the same type.

18. The non-transitory computer readable medium of claim 14, wherein the processor is further configured to receive a margin loss for the semiconductor IC and correlate the received margin loss with the workload.

19. The non-transitory computer readable medium of claim 14, wherein the processor is further configured to determine a margin loss for the IC based on the determined workload and a stored correlation between workload and margin loss.

20. The non-transitory computer readable medium of claim 14, wherein the processor is further configured to selectively enable or disable a Negative-Bias Temperature Instability (NBTI) mode for at least a portion of the semiconductor IC, and determine the workload for the NBTI mode when the NBTI mode is enabled.

21. The non-transitory computer readable medium of claim 14, wherein the processor is further configured to generate a notification signal based on a comparison of the determined workload with a predetermined criterion, the notification signal being indicative of one or more of: a state or age of the IC, one or more guard-bands for the IC, and a maintenance or replacement condition.

22. The non-transitory computer readable medium of claim 14, wherein the processor is further configured to compare the determined workload with a statistical lifetime workload for ICs of a same type as the IC.

23. The non-transitory computer readable medium of claim 1, wherein the input of said ROSC is switchably coupled to receive the electrical current from the output of the functional transistor, such that the processor is configured to determine:
   a reference frequency based on the oscillation frequency of the ROSC when the input of ROSC does not receive the electrical current from the output of the functional transistor; and
   a sensor measurement frequency based on the oscillation frequency of the ROSC when the input of ROSC receives the electrical current from the output of the functional transistor.

* * * * *